United States Patent

Cochran et al.

[15] 3,702,042

[45] Nov. 7, 1972

[54] ABRADING APPARATUS

[72] Inventors: Thomas J. Cochran, Lagrangeville; Charles P. Coughlin, Chelsea; Walter W. Ficker, Fishkill; Charles V. Lent, Poughquag; Joseph M. Sullivan, Millbrook, all of N.Y.

[73] Assignee: International Business Machines Corporation, Armonk, N.Y.

[22] Filed: Nov. 25, 1970

[21] Appl. No.: 92,818

[52] U.S. Cl. .......................................51/8, 51/165 R

[51] Int. Cl. ...............................................B24c 3/04

[58] Field of Search ..........51/8, 14, 15, 50 R, 95 LH, 51/165 R, 165.76, 319

[56] References Cited

UNITED STATES PATENTS

| | | | |
|---|---|---|---|
| 2,707,356 | 5/1955 | Bayha | 51/8 |
| 2,743,554 | 5/1956 | Dailey et al | 51/15 |
| 2,773,332 | 12/1956 | Buchman et al | 51/15 |
| 3,425,166 | 2/1969 | Best et al. | 51/14 |
| 3,488,890 | 1/1970 | Owens et al | 51/165 R |
| 3,534,503 | 10/1970 | Kulischenko | 51/8 |

*Primary Examiner*—Lester M. Swingle
*Attorney*—Hanifin and Jancin and William J. Dick

[57] ABSTRACT

This patent discloses apparatus for altering the electrical characteristics of electrical and electronic components by trimming or abrading, the rate of abrading being variable and is responsive to changes in the electrical characteristics of the components during the abrading operation. Electrical components that have electrical characteristics that may be altered by the abrading apparatus include resistors, capacitors, inductors, semiconductive devices, and photocells.

The apparatus includes electrical circuitry for both accurate control of the rate of abrasion and enabling production of electrical and electronic components to predetermined characteristics with unusually close manufacturing tolerances. The circuitry includes a highly sensitive Kelvin bridge at each abrading station, the circuitry being programmable for trim pretesting, control of the rate of abrading, and post-testing. The circuitry may also be programmed to abrade a discrete component to predetermined tolerances, and/or abrade one of a pair of components to a predetermined ratio of the electrical characteristic of one component to the electrical characteristic of the other of the pair. Additionally, the circuitry may be programmed to abrade one component in a connected closed loop of components to predetermined tolerances, for example "in circuit" abrading.

The mechanical arrangement of the apparatus provides for sequentially abrading multiple electrical and electronic components which may be positioned on both the upper and lower surfaces of single insulating members such as ceramic substrates. The apparatus is fully mechanized for rapid processing of a high production product through sequential abrading stations and includes stations for rejecting out-of-tolerance components.

20 Claims, 38 Drawing Figures

INVENTORS
THOMAS J. COCHRAN
CHARLES P. COUGHLIN
WALTER W. FICKER
CHARLES V. LENT
JOSEPH M. SULLIVAN
BY William J. Dick
ATTORNEY

ABRADING APPARATUS

SUMMARY OF THE INVENTION AND STATE OF THE PRIOR ART

The present invention relates to apparatus for altering the characteristics of components and more particularly relates to a fully mechanized production machine for accurately adjusting the electrical characteristics of electrical and electronic components by a variable rate of abrasion of the components.

The electronic computer industry requires precision electrical and electronic components in increasingly large quantities and at lower unit costs. With regard to adjusting, for example, the value of resistors by abrasion, existing apparatus using a constant rate abrading process has encountered numerous difficulties in producing precision components in high speed production. Using a constant rate of abrasion, the rate of change of the ohmic value of the resistor is a variable which changes with the quantity of material to be abraded. The ohmic value increases slowly as it approaches a predetermined value. For example if there is considerable resistor material remaining to be adjusted by abrasion conversely, if there is little material remaining to be adjusted, the ohmic value increases rapidly as the resistor is abraded. Additionally, the mechanism stopping the abrading action requires a finite and definite time period to function. Thus if the mechanism is accurately calibrated for a slow rate of increase of the ohmic value of the resistor (i.e. large quantity of resistor material to be abraded) it will stop the abrading action too late if there is a fast rate of increase in the ohmic value. Stopping the abrading too late results in a resistor of a higher ohmic value than the predetermined value and this must be subsequently rejected as scrap. Conversely, if the abrasion stopping mechanism is calibrated for a fast rate of increase in ohmic value, the mechanism will stop abrasion too soon for a resistor having a large quantity of material and thus a slow rate of increase in ohmic value. In stopping the abrasion too soon the resistor is adjusted to a lower ohmic value than the predetermined value and must be either scrapped or reworked by further abrasion.

The procedure presently employed on state of the art abrasion or trimming apparatus to avoid these problems is to reduce the constant abrading speed to a low value whereby the abrasion stopping time becomes a very small fraction of total abrading time. The abrading stopping mechanism is then calibrated to an intermediate between slow and rapid rates of change of ohmic values corresponding to the reduced abrading speed. This procedure is a poor compromise, at best, since it both reduces production throughput due to the reduced abrading speed and compromises ohmic accuracy for slow and rapid rates of change of ohmic values.

The present invention avoids the above described problems and provides both a high production throughput and a high ohmic accuracy by using a variable abrading speed instead of a constant abrading speed. More specifically, if there is considerable material to be removed by abrading, the apparatus senses this condition and a servo-mechanism provides an initially high abrading speed which is automatically and progressively reduced to a very low speed as the resistor approaches its predetermined value. Likewise, if there is little material to be removed by abrading the servo-mechanism which provides an initially low abrading speed which is automatically and progressively reduced to a very low speed as the resistor approaches its predetermined value. Thus, the present invention meets the requirements for high speed production of precision components by using a variable abrading speed with an initially presettable high abrading speed to reduce the abrading time when there is considerable material to be removed by abrading and a deaccelerating abrading speed for precision adjustment as the electrical characteristics of the components approach predetermined and desired values. The net result is that components such as resistors can be adjusted two to four times faster with tolerances of one-half to one-fourth compared to state of the art apparatus and methods.

As an integral part of the present invention the novel electrical circuitry and mechanical arrangement of the apparatus cooperate to thereby contribute to the overall high performance.

In view of the above, it is a principal object of the invention to provide a high throughput production machine for adjusting electrical characteristics of electrical and electronic components by a variable rate of trimming of the components.

Another object is to provide novel apparatus for adjusting the electrical characteristics of components such as resistors, capacitors, inductances and semiconductor devices by a variable rate of abrasion of the components.

An additional object is to provide a highly accurate control system for adjusting electrical characteristics of electrical and electronic components to predetermined values by a variable rate of abrasion of the components, which variable rate of abrasion is responsive to the control system.

Another object of the present invention is to provide a machine for adjusting the electrical characteristics of electrical and electronic components to predetermined values by varying the rate of abrasion of the components, the variable rate and rate of abrasion decreasing as the electrical characteristics of the components approach the predetermined values.

A further object is to provide a mechanized high production machine in which the electrical characteristics of multiple components in an electrical circuit can be adjusted by a variable rate of abrasion.

An additional object is to provide a mechanized apparatus for adjusting the electrical characteristics of components positioned on two or more surfaces of an insulator.

Another object of the present invention is to provide a production machine having the capability of handling assorted types of electrical and electronic components, the characteristics of which can be altered by multiple abrading means and wherein the components and the abrading means can be mutually prealigned to predetermined starting points prior to abrading the components.

A further object of the present invention is to provide novel high production apparatus, having the capability for handling assorted types of electrical and electronic components, wherein a component may be abraded at a variable rate, and wherein relative motion between the component and the abrasion means is along a predetermined vector (path) starting from a predetermined point relative to the component.

Other objects and a full understanding of the present invention may be had by referring to the following specification and claims taken in conjunction with the accompanying drawings in which:

INTRODUCTION

The novel abrading apparatus of this invention has many new features that overcome numerous difficulties inherent in previously available abrading apparatus. The value of the novel features may be more fully appreciated by the presentation of a relatively detailed operational description of the apparatus together with dimensional examples illustrating the difficulties encountered therewith. The mode of operation of the apparatus may be best introduced and understood by referring to the schematic FIG. 1 of the drawings. For purposes of example, the component considered for adjustment by abrasion is a resistor. However, it should be recognized that the present invention is not limited to the adjustment of resistors.

ABRADING PRINCIPLES

For purposes of illustration, two embodiments of the invention are presented as examples, but it should be understood that the invention can be implemented in many other embodiments without limiting the scope thereof.

Figure 1:
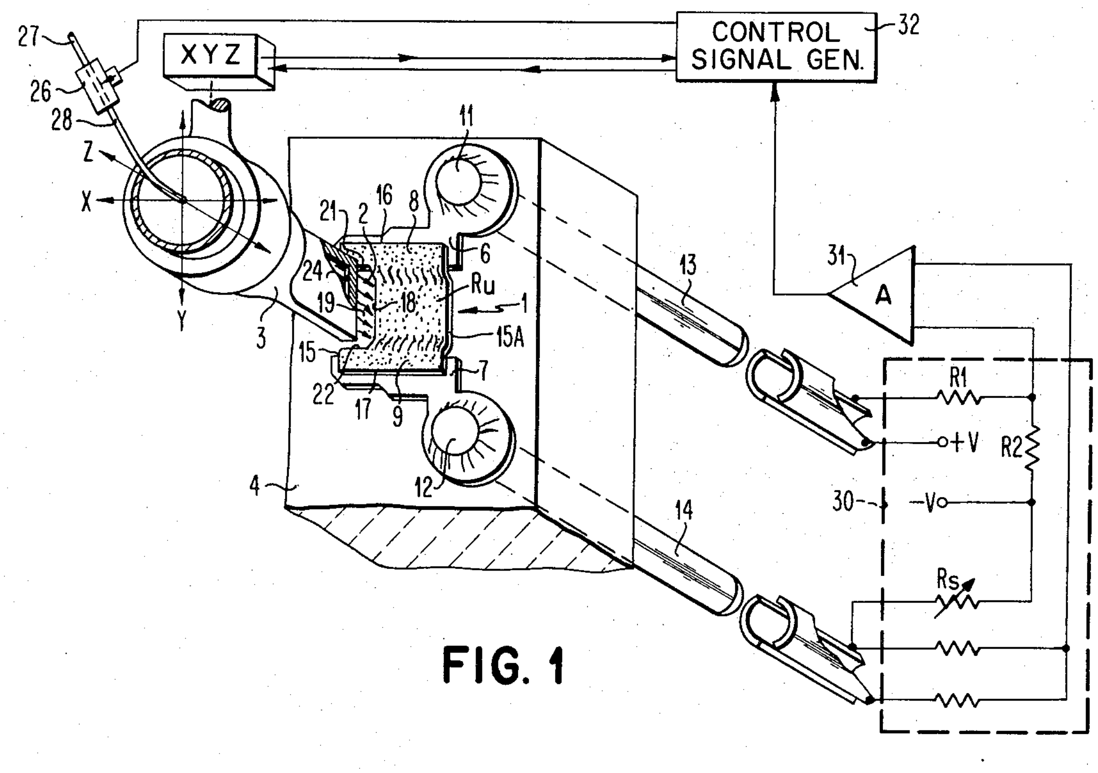
FIG. 1 is a fragmentary perspective schematic drawing illustrating the relationship of an abrading means to an electrical component the value of which is being adjusted in accordance with the present invention, and including simplified servo controls and associated electrical circuitry.

Referring first to FIG. 1, an electrical or electronic characteristic such as an ohmic value, of an electrical or electronic component such as a resistor Ru, is illustrated as being adjusted by a stream 2 of fluid propelled abrasive particles dispelled from a nozzle 3, which particles are removing material from the resistor Ru by abrasion. In the present instance the nozzle 3 is adjacent to, and moving from left to right relative to the resistor.

In the illustrated instance, the resistor is mounted on a carrier which is adapted to receive other active and passive components, the carrier being capable of being received by a circuit board and the like for use in electronic apparatus such as a computer. To this end, the resistor Ru which includes an upper and lower portions 8 and 9 respectively, may be bonded onto a ceramic substrate 4, the resistor overlapping and making electrical contact with electrodes 6 and 7 respectively which are bonded onto the substrate 4. It should be noted that the substrate 4 may have a plurality of resistors and electrode pairs bonded to the front and/or back surfaces of the substrate 4, although for example purpose, only one such resistor and pair of electrodes are shown.

In order to facilitate mounting of the substrate onto a circuit board and the like, the electrode may be connected to pins, in the present instance the electrodes 6 and 7 being soldered to pinheads 11 and 12 of pins 13 and 14 respectively. The pins 13 and 14 are secured in and extend through the substrate 4 to provide sturdy electrical terminal connections for the resistor Ru. It should be noted that the substrate 4 may include a plurality of pins, for example some substrates presently being manufactured utilize 37 pins. These pins provide separate electrical terminal connections to multiple electrical and electronic components supported by the substrate 4, although only two such pins are shown in FIG. 1.

In accordance with the invention the rate of nozzle movement and deacceleration is controlled by the changing ohmic value of the resistor during abrasion. To this end, and as best illustrated in FIG. 1, a Kelvin bridge is provided which directly compares the voltage drop across the substrate resistor Ru to the voltage drop across a precision variable resistor Rs in the Kelvin bridge 30. When the two voltage drops are equal the bridge signals through a differential amplifier 31 a control signal generator 32 and associated circuitry that trimming is complete which closes off a grit valve 26 located in a grit supply line 27 which provides through suitable tubing the grit to the nozzle 3. It should be noted that the logic and control signal generator 32 also is connected electrically to X, Y, and Z nozzle actuator servo mechanism to cause the nozzle 3 to move in a preprogrammed direction along one of the axis. The manner in which this is accomplished will be more fully explained in the section entitled "Abrasion Control Circuitry." Suffice at this point to note that the Kelvin bridge 30 is provided with a suitable power supply (+V, −V) a pair of equal valued resistors R1 and R2 which form one side of the bridge, while resistor Ru (on the substrate) and the variable precision resistor Rs form the opposite leg or the other side of the bridge. It is noted that this bridge circuitry should be utilized when the resistor being trimmed is in a separate circuit, is being trimmed to a specific value and can be electrically isolated from the other resistors on the substrate.

GENERAL DESCRIPTION

Industrial Applications and Production Practices

Devices on substrates such as the resistor Ru on the substrate 4 are produced in very large quantities in the electrical and electronic industries. One of the largest usages of such resistors on substrates is in the circuits of electronic computers which require the use of close tolerance resistors; i.e., resistors produced to specified ohmic values with all resistors in the production lot having an ohmic value within one percent of the specified ohmic value. For example, if the specification for a particular computer circuit requires a resistor of 160 ohms, plus or minus one percent, all resistors of the production lot should have ohmic values between 158.40 and 161.60 ohms. In the particular example, any resistor produced that is outside of the specified one percent tolerance limits of 161.60 ohms to 158.40 ohms is considered a production loss and must be scrapped together with associated substrates.

Industry commonly produces close tolerance resistors by adjusting upwardly by abrading coarse tolerance resistors of lower ohmic values. Thus the production of large quantities of close tolerance resistors first requires the production of large quantities of coarse tolerance resistors. The production process and equipment is conventionally a modification of the well-known silk screen apparatus and process wherein electrodes and resistor material is deposited on the substrate and then fired.

PROCESS VARIABLES

Resistors such as the resistor Ru as originally bonded to the substrate 4 in a large production lot may vary considerable in their ohmic valves and thus give rise to difficulties when their ohmic values are adjusted to become close tolerance resistors by subsequent abrasion. Processing variables such as small changes in the composition and viscosity of the resistor paste and screen wear may cause a variable thickness of resistor paste to be deposited on the substrate 4 and which, after bonding to the substrate 4 and prior to abrading, results in a considerable variance in the ohmic values of the resistors of the production lot. Additionally, the thickness of individual resistors may vary from point to point on the surface of the resistor.

As examples of such variance in ohmic values, the production of a large lot of 160 ohm close tolerance resistors may start with resistors such as the resistor Ru having an average thickness of the resistor material 0.005 inch thick and having an average ohmic value of 100 ohms for the production lot. However within the production lot there may be a number of resistors varying from average thickness and ohmic values by as much as plus or minus 20 percent, i.e., plus or minus 0.001 inch and plus or minus 20 ohms. It should be noted that ohmic values vary inversely with resistor thickness, thus an 0.006 inch thick resistor may have an ohmic value of 80 ohms and a 0.004 inch thick resistor may have an ohmic value of 120 ohms.

Occasionally a momentary plugging of a screen orifice may partially reduce the deposition of resistor paste on the substrate 4. Under such circumstances a few resistors may be produced that are within the close tolerance ohmic value limits of 158.40 to 161.6 ohms prior to abrading and hence require no abrading. Similarly, a few resistors may be produced that are above the high ohmic tolerance value of 161.60 ohms and which would be rejected as scrap since abrading could only increase their ohmic value further beyond the high ohmic tolerance value of 161.60 ohms.

DIMENSIONAL EXAMPLES

The production problems encountered in producing close tolerance 1 percent resistors by abrasion from resistors that may vary as much as plus or minus 50 percent prior to abrasion may be best illustrated by using the previous examples of variable ohmic values supplemented by comparitive scale dimensions. The resistor Ru, prior to the initiation of abrasion, may have had an area bonded to the substrate 4 measuring 0.060 inch horizontally from a left edge 15 to a right edge 15A and about 0.050 inch from a top 16 to a bottom 17 abutting the underlying electrodes 6 and 7 respectively. The film thickness of the resistor Ru over the surface of the substrate 4 and also over the electrodes 6 and 7 is typically about 0.004 to 0.006 inch, while the film thickness of the electrodes 6 and 7 is typically about 0.003 inch. A void or slot 19 is progressively formed in the resistor Ru by the abrading action of the stream 2 of abrasive particles as relative left-right motion (at about 0.010 inch per second) between the nozzle 3 and the resistor Ru causes the abrasive action of the stream 2 to progress from the left edge 15 toward the right edge 15A of the resistor Ru. At an instant of time during the progressive forming of the void 19 by abrasive removal of material from the resistor Ru, the resistor material may have been removed over an area measured horizontally of about 0.015 inch and vertically of about 0.040 inch. A typical orifice 24 of the nozzle 3 may measure about 0.040 inch by about 0.006 inch. Within the area of the void 19, the material of the resistor Ru has been removed by abrasion to expose the bare surface of the ceramic substrate 4.

The progressive forming of the void 19 by removal of material from the resistor Ru progressively increases the ohmic value of the resistor Ru as may be measured by an ohmmeter or other suitable instrumentation connected to the pin heads 11 and 12 or pins 13 and 14 and which includes the resistor Ru in the ohmic measuring circuit.

The increasing ohmic value of the resistor Ru at any moment during the abrasive forming of the void 19 in the resistor Ru is given by the approximate equation:

$$Rx = R1\frac{1.00}{1.00-\frac{k}{L}}\text{; Equation I, where:}$$

Rx = the momentary ohmic value of the resistor Ru during the abrasive forming of the void 19 in the resistor Ru.

R1 = the pre-abrasion original ohmic value of the resistor

K = the momentary linear dimension of the void 19 from the left edge 15 of the resistor Ru to the right edge 18 of the void 19 as the void is being abrasively formed in the resistor Ru.

L = the pre-abrasion original linear dimension from the left edge 15 to the right edge 15A of the resistor Ru.

If the original unabraded ohmic value of the resistor Ru had been 80 ohms and using the comparative scalar dimensions previously cited, the instantaneous ohmic value R of Ru during the progressive abrasive forming of the void 19 in the resistor Ru as illustrated in FIG. 1 would be approximately:

$$Rx = 80\frac{1.00}{1.00-\frac{.015''}{.060''}} = 106.66\text{ ohms; using Equation I.}$$

Figure 2:
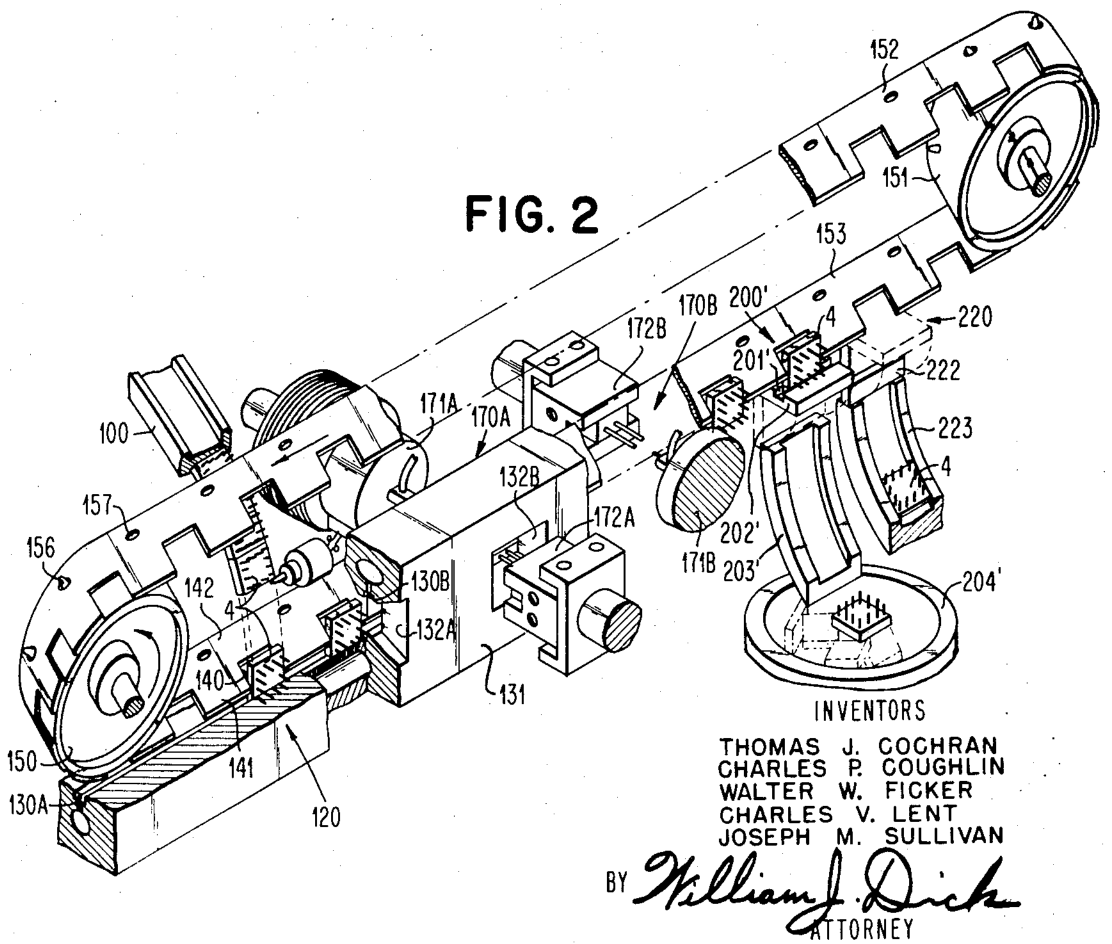
FIG. 2 is a fragmentary schematic perspective drawing illustrating the spatial relationship of major mechanical elements of a first embodiment of the invention.

Additional features of the invention and the spatial arrangement of important mechanical elements of the improved abrading apparatus may be understood by referring to the schematic drawing FIG. 2. In the interest of simplicity ancillary structural members and mechanisms are not shown in the schematic drawing but will be adequately described hereinafter.

In the first embodiment of the invention illustrated in FIGS. 1–11, substrates having at least one resistor thereon for trimming, are serially brought into registry with an indexing transport belt or tape which conveys the substrates into position for abrading the resistor or resistors in one or more serially arranged abrading stations 170A, 170B etc. and then through reject station 200' or accept station 220.

To this end and referring first to FIG. 2, a substrate guide chute 100 guides individual preoriented substrates 4 into a transport loading station 120 comprising a horizontally extending U-shaped guide track 130A in a guide block 131, the right and left edges of the substrate being engaged within a notch 140 of a plurality of spaced notches along an edge 141 of the continuous loop indexing transport tape 142. The U-shaped guide track 130A provides a continuous guide for the lower edge of the substrate 4 as the substrate is progressively indexed through the serially arranged operating stations of the abrading apparatus.

The substrate transport tape 142 which may be formed of a thin stainless steel in a closed loop, is guided by and runs over pulleys 150 and 151 which are arranged to maintain the loop in tension such that the upper portion 152 and lower portion 153 of the loop of the transport tape 142 are maintained essentially straight and parallel to each other. The left pulley 150 is periodically indexed in clockwise rotation by an indexing drive mechanism (not shown). Drive pins 156 having an involute profile are uniformly spaced about the circumference of the pulley 150 and engage uniformly spaced drive holes 157 in the transport tape to maintain indexing synchronism between the pulley and the transport tape as the pulley is periodically indexed.

After loading of the substrate into the track 130A, the first tape index moves the substrate 4 into engagement in an upper U-shaped track 130B in the continuous guide block 131. Periodic openings 132A, 132B through the guide block 131 provide access to the substrate 4 such as is shown at the abrading station 170A. More specifically at the abrading stations an abrading nozzle assembly 171A and a contact block or monitoring head 172A may be aligned so that the abrading nozzle assembly at each station abrades the resistors on the pinhead side of the substrate 4 while the monitoring head 172A makes contact with the pins of the resistor being abraded, such as pins 13 and 14 on the pin side of the substrate assembly. As may be noted from FIG. 2, if resistors are located on the pin side of the substrate, the position of the contact block assembly and abrading nozzle assembly is reversed. For example, at the abrading station 170B the abrading nozzle assembly 171B is arranged to abrade a resistor 1 which may be located on the pin side of the substrate 4, while the monitoring head 172B contacts pinheads such as 11 and 12 which may be electrically connected to the resistor on the pin side of the substrate.

Prior to and at completion of abrasion of the individual resistors on the substrate at each of a plurality of sequential abrading stations such as above described, the individual resistors are tested for reject/accept compliance with the ohmic value specifications in order that the rejected product may be subsequently indexed to and separated from the accepted product at the reject station 200′ while the accepted product is indexed further onward to the accept station 220. In a conventional manner the test information may be entered into a "read/write" memory system including, for example, a shift register, which transfers the reject/accept status data of the resistor to sequential stations. For example, if the substrate assembly 4 had thereon eight resistors such as the resistor Ru each of the eight resistors were individually abraded and tested at one of eight abrading stations, then the transfer memory system would have the reject/accept status data of all eight of the individual resistors at the eighth abrading station and subsequent stations such as the reject station 200′ and the accept station 220.

By way of example to enable one skilled in the art to construct the logic circuitry required for an accept/reject function, the reject/accept status of a substrate 4 may be determined each time a substrate is indexed to the reject station 200′. At the station 200′ the programmed system of the abrading apparatus interrogates an eight-way logic circuit of the transfer memory system for the accept data status of all eight of the resistors Ru. The interrogation may initiate two alternate functions at the station 200′:

a. If one or more of the eight resistors Ru on the substrate 4 had been outside of the close tolerance limits after abrasion and had been assigned a reject status at its corresponding abrading station 170A, 170B, etc. then the interrogation of the eight-way logic circuit results in a reject signal for the substrate 4 at the station 200′. When a reject signal results from the interrogation the signal is amplified and may be used to actuate a solenoid (not shown) which retracts a swinging trap 202′ under the substrate 4 at the station 200′. Retraction of the swinging trap 202′ will allow the rejected substrate 4 to eject by gravity onto a reject chute 203′ which guides the substrate to a reject container 204′.

b. If all of the eight resistors on the substrate 4 had been within close tolerance limits after abrasion and all had been assigned an accept data status at their corresponding abrading stations 170A, 170B, etc. then the interrogation of the eight-way logic circuit would result in no signal which would be interpreted as an accept signal for the substrate 4. With no signal the swinging trap 202′ under the substrate 4 is not retracted and the next index of the transport moves the substrate to the accept station 220.

Similarly at the accept station 220 the programming system may interrogate an eight-way logic circuit of the transfer memory system for the accept data status of all eight of the resistors Ru. If all eight resistors have been assigned an accept data status an accept signal may be generated, amplified, and then used to actuate a solenoid (not shown) which retracts a swinging trap 222 under the substrate 4 at the station 220. Retraction of the swinging trap 222 allows the accepted substrate to drop by gravity onto an accept chute 223 which guides the accepted substrate to a collection area (not shown).

THE ABRADING APPARATUS

In the embodiment of the abrading apparatus illustrated in FIGS. 3–11, a substrate 4 is positioned intermediate the abrading nozzle 3 and the monitoring head 172, the nozzle 3 moving into position adjacent the substrate while the monitoring head 172 moves into contact with either the pin or pin head side of the substrate, in the illustrated instance the pin side. As shown, the abrading apparatus includes a frame 275 with upstanding side portions 276, 277 through which extend respectively the monitoring head 172 and the nozzle assembly 171. The frame is mounted on an upstanding base 278 to which is connected nozzle assembly actuation means 50 for effecting both X and Y motion to the nozzle assembly 171. As illustrated the lower portion 279 of the frame 276 extends horizontally connecting the upstanding sides 276 and 277 and provides, by suitable ribs 281 and 282, adequate support for the monitoring apparatus and nozzle assembly. The actuation means 50 is connected through an aperture 280 to a support 41 connected to a nozzle casing 42 which in the illustrated instance forms a part of the nozzle assembly 171.

Figure 3:
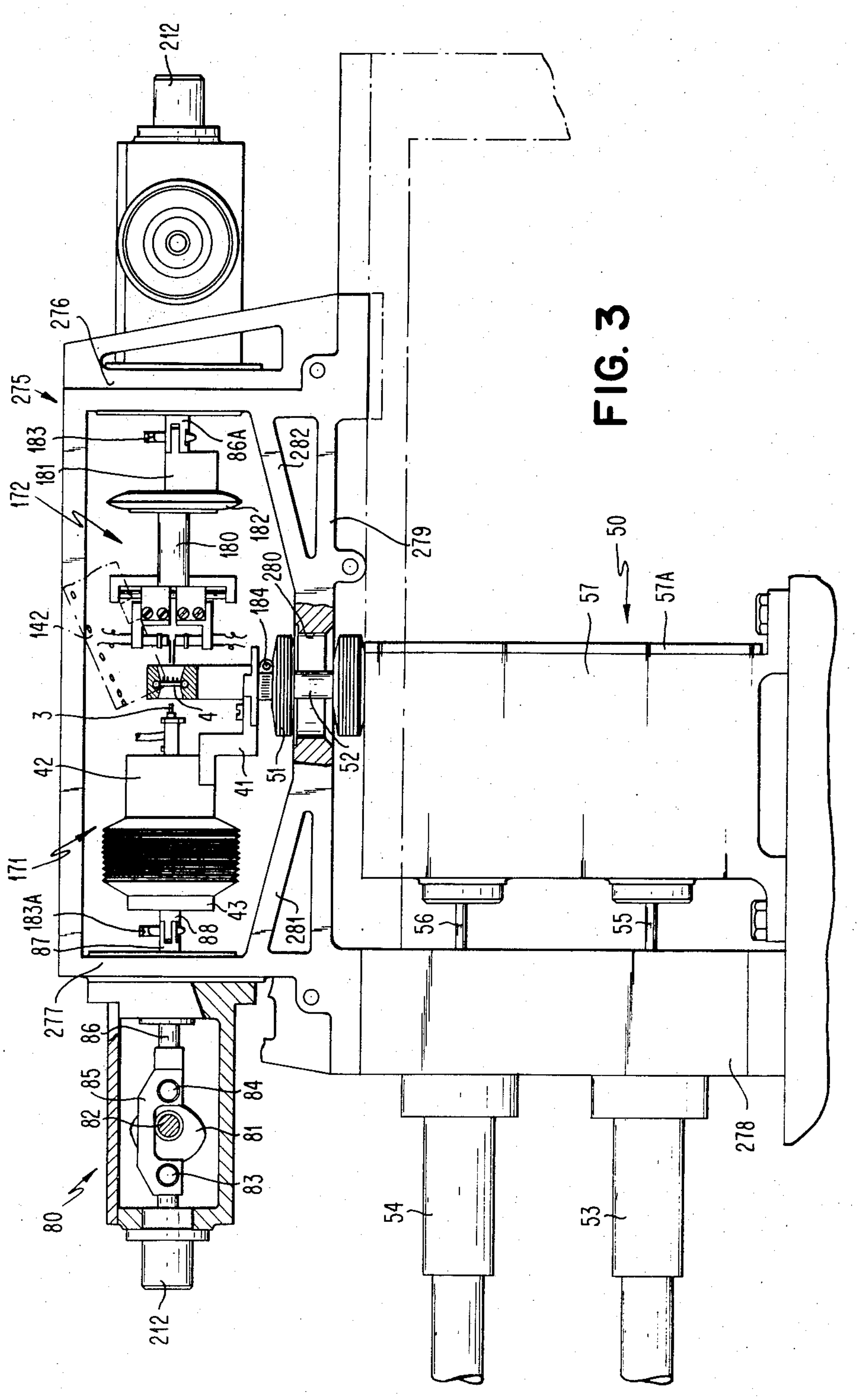
FIG. 3 is an enlarged fragmentary sectional view in side elevation of a portion of the apparatus illustrated in FIG. 2.

To prevent grit from entering the actuation means the aperture 280 is covered as by a flexible bellows 51, there being mounted coaxially thereof an actuation post 52 which is directly connected through the bellows to the support 41. In the illustrated instance, the actuation means 50 moves the nozzle assembly 171 and thus the nozzle 3 along the X axis (into and out of the paper relative to FIG. 3) and along the Y axis (vertically). Movement of the nozzle assembly 171 along the Z axis, i.e. from left to right or vice versa towards and away from the substrate 4 is accomplished by Z axis actuation means 80 which comprise a cam 81 mounted for rotation as by a shaft 82, the cam being adapted to engage cam followers 83 and 84 mounted in a bracket 85 and connected to, for example, a coaxial nozzle assembly drive shaft 86. As illustrated in FIG. 3, the drive shaft extends through the upstanding side member 277 of the frame and is releasably connected to a stub shaft 88 by a pin 183A and which in turn is connected to a base 43 on the nozzle assembly 171. Therefore, by rotating shaft 82, the drive shaft 86 may be oscillated towards and away from the substrate 4.

In accordance with a feature of the invention, the monitoring head 172, connected through the actuation means 50, controls the movement of the nozzle assembly 171 to permit particulate abrasion of the resistor Ru until the resistor is approximately the desired value and then reduces the rate of abrasion by deaccelerating the nozzle assembly movement until the desired ohmic value is obtained.

Inasmuch as the actuator means 50 is adapted for effecting movement of the nozzle assembly 171 along the X or Y axis, X and Y axis drive actuators, which may include hydraulic servo mechanism are illustrated in phantom lines in FIG. 3 and designated 53 and 54 for the X and Y axis respectively. These mechanisms connect through suitable drive shafts 55 and 56 the apparatus for such nozzle assembly movement.

Figure 4:
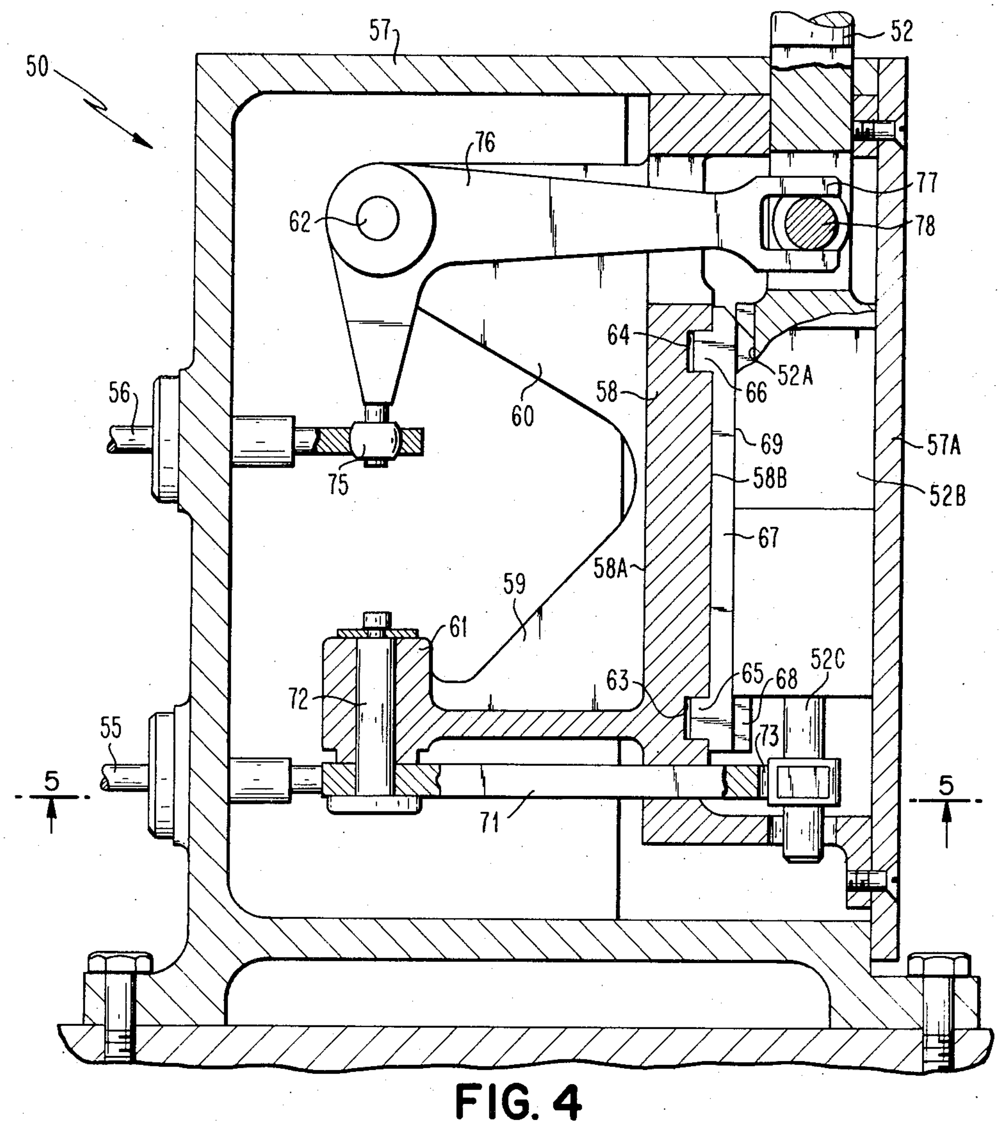
FIG. 4 is an enlarged fragmentary side elevational sectional view of a portion of the apparatus illustrated in FIG. 3.
Figure 5:
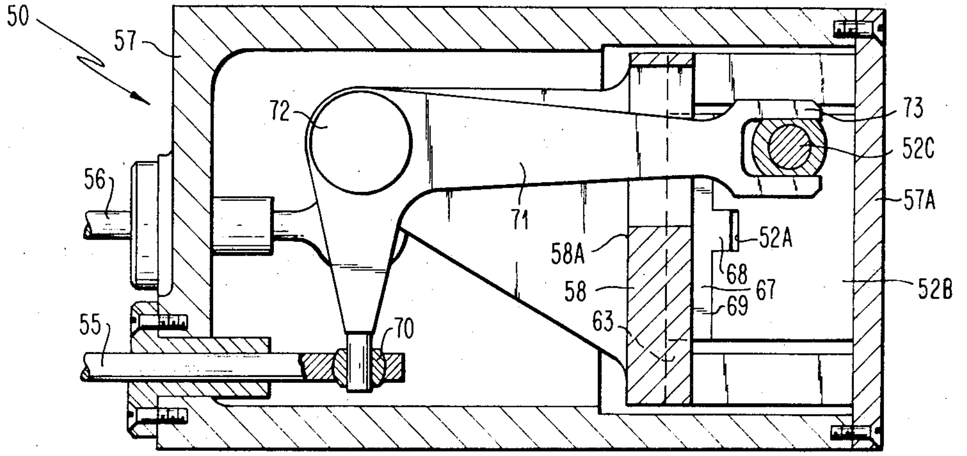
FIG. 5 is a fragmentary sectional view taken along line 5—5 of FIG. 4 and as if FIG. 4 were not in section.

In order to effect both X and Y axis movements to the actuation post 52, the drive shafts 55 and 56 are coupled through a casing 57 to separate but coactuable X and Y coupling means to effect such X and Y movement of the actuation post and thus the nozzle assembly. To this end and as best shown in FIGS. 4 and 5, interiorally of the casing 57 is an upstanding wall 58 including laterally extending webs 59 and 60 which project from the rear 58A of the wall 58 and terminate respectively in a boss 61 and pin 62, the boss 61 being situated parallel to the web 59 and 60 and the pin 62 being perpendicular to the plane of the web. On the front 58B of the wall 58 are a pair of laterally extending slots 63 and 64 which extend into and out of the drawing. The slots are adapted for cooperation with a pair of projecting, close fitting slides 65 and 66 which are connected to an upstanding platform 67, the platform being capable of, relative to FIG. 4, movement into and out of the paper. As best shown in FIG. 5, the platform 67 includes an additional guide 68 which projects from the frontal surface 69 thereof, which guide is perpendicular to the slides 65 and 66. The guide 68 acts as a key and a slide by fitting into an axially extending slot 52A in an enlarged portion 52B of the actuation post 52. It should be noted that the enlarged portion 52B of the actuation post 52 abuts in sliding engagement against an upstanding cover plate 57A which is connected to the casing 57. As will be described hereinafter, the guide 68 cooperating with the slot 52A permits vertical reciprocation of the actuation post 52 (relative to FIG. 4) while the slide 65 and 66 cooperating with the slots 63 and 64 in the front wall 58 permit horizontal movement of the actuation post 52.

In order to effect movement along the X axis of the actuation post 52 and thus the nozzle assembly 171, lever means are connected to the actuation means so that axial reciprocation of the drive shaft 55 permits movement of the post 52 along the X axis. To this end and referring to FIG. 5, the drive shaft 55 is coupled through a universal joint 70 to a bell crank 71 which is pivoted through a pin 72 mounted in the boss 61. The opposite end of the bell crank 71 has a bifurcated terminal end 73 which embraces a shaft 52C extending from the enlarged portion 52B of the actuation post 52. Thus movement of the drive shaft 55 causes rotation of the bellcrank 71 effecting lateral movement of the actuation post 52 by way of the platform 67 and its associated slides 65 and 66.

In a like manner, the drive shaft 56 is connected through suitable lever means to the actuation post 52 to effect vertical (FIG. 4) movement of the actuation post 52. As shown in FIG. 4, the drive shaft is connected through a universal joint 75 to a bell crank 76 for rotational displacement about the pin 62. As illustrated, the opposite terminal end of the bell crank is bifurcated as at 77 and embraces a pin 78 which projects at a right angle from and is connected to the actuation post 52. In this manner, actuation of the drive shaft 56 permits vertical reciprocation of the post 52 thereby moving the nozzle assembly 171 along the Y axis. The bell cranks 71 and 76 are adapted for withstanding right angle movements of the opposite bell crank, the bifurcated terminal ends preferably being coupled to the post by bushings and the like which permit movement of the post in a direction perpendicular to the plane of the bell cranks.

Figure 6:
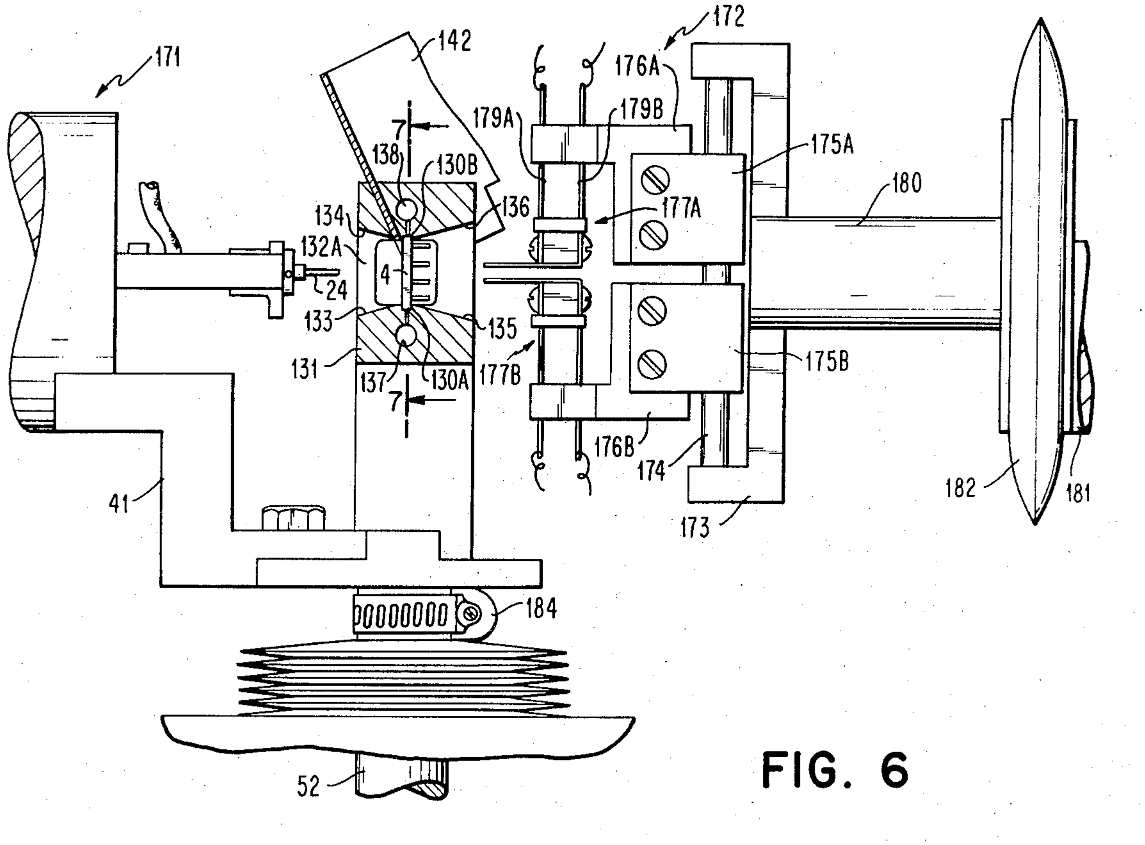
FIG. 6 is an enlarged fragmentary view of a portion of the apparatus illustrated in FIG. 3.

As best shown in FIG. 6, the periodic openings 132A in the guide block 131 are preferably formed with diverging side walls, for example the upper and lower walls 134, 133, for ease of access of the nozzle 24 into a position adjacent the substrate 4, and diverging side walls such as the upper and lower walls 136, 135, for ease of entry and egress of portions of the monitoring head.

Upon the tape conveyor 142 indexing a substrate into position intermediate the nozzle 24 and monitoring head 172, it is desirable to reduce the friction of the substrate against the guide tracks as much as possible and then to clamp the substrate in a precise position for the abrading operation.

Figure 7:
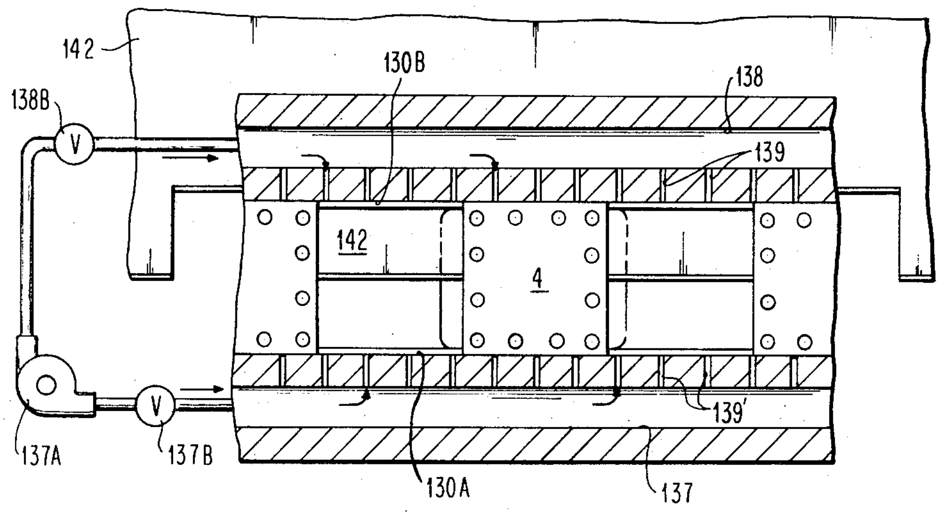
FIG. 7 is an enlarged sectional view taken along line 7—7 of FIG. 6 and as if FIG. 6 were not in section.
Figure 8:
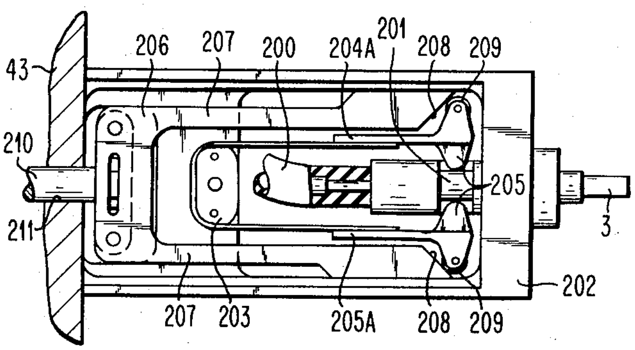
FIG. 8 is a fragmentary side elevational view of a portion of the apparatus illustrated in FIGS. 3 and 6 with parts broken away to illustrate a feature of the present invention.

To this end and as best illustrated in FIG. 7, parallel gaseous media conduits 137 and 138 are provided below and above the U-shaped guide tracks 130A and 130B respectively to permit gaseous media such as air to flow through slots or jets 139, 139′ onto the edges of the substrate 4. In this manner the substrate's frictional resistance against the guide tracks is reduced during movement of the substrate along the guide tracks. The positive air pressure may be supplied by conventional air supply means 137A through valves 137B, 138B and kept actuated at least the portion of the cycle during which the conveyor 142 is moving.

In order to clamp the substrate during the abrading operation, gaseous media flow through at least one of the conduits 137 and 138 is terminated, the opposite conduit being permitted to continue the flow to effect a gentle pressure on the substrate in the guide track on the opposite edge of the substrate. In the present instance, air flow through conduit 137 is terminated as by valve 137B whereby the flow of air through jets 139 urges the substrate against the guide track 130B.

The monitoring head 172 is timed with the nozzle assembly 171 so that it extends and retracts substantially simultaneously therewith, the extension and retraction of course being associated by suitable timing means (not shown) with the tape index. The monitoring head 172, as best illustrated in FIGS. 3 and 6, is connected to an actuator shaft 180 which is eccentrically mounted with respect to a coupling shaft 181 as through an adjustable locking disc 182. The locking disc functions in conjunction with the actuator shaft 180 to permit eccentric motion of the shaft 180 so as to facilitate adjustment of the monitoring head position relative to the pins or pin heads on the substrate 4. The coupling shaft 181 may be splined to a coaxial drive shaft 86A (FIG. 3) which is identical to the drive shaft 86 which is connected to the nozzle assembly 171. Additionally, the drive shaft 86A is connected to the coupling shaft 181 as by a pin 183.

At this point it should be noted that when it is desirable to adjust the value of resistors on the pin side of the substrate, i.e. the side opposite of that illustrated in FIG. 4, means are provided for uncoupling the nozzle assembly 171 rotating it 180° and joining it to the coaxial drive shaft 86A. In this event the monitoring head 172 is also turned 180° and connected to the coaxial nozzle assembly drive shaft 86. As illustrated in FIG. 3 and as heretofore described, the drive shaft 86 also contains splines as at 87 which coact with like splines on a stub shaft 88 which is connected to the base 43 of the nozzle assembly 171. When it is desirable to have the nozzle assembly 171 move to the position of the monitoring head shown in FIG. 3, the pin 183A is removed, the shaft 86 uncoupled, a coupling collar 183 connecting the actuation post 52 to the support 41 loosened, and the nozzle assembly merely rotated until the stub shaft 88 is in a position for coupling with the shaft 86A.

It should be noted that the means for actuating the coaxial drive shaft 86A to cause the shaft to reciprocate towards and away from the substrate 4 is identical to the means heretofore described relative to the actuation of the nozzle assembly 171 towards and away from the substrate 4.

The monitoring head 172 includes a yoke 173 which is connected to the shaft 180, the yoke including at least one slide rod 174 to which may be connected adjustable upper and lower slide bushings 175A, 175B. As illustrated, the slide bushings are connected to L-shaped angles 176A, 176B which mount thereon upper and lower probe assemblies 177A, 177B. The monitoring probes are shown schematically in FIG. 6 but will be more fully explained hereinafter relative to FIGS. 10 and 11. Each of the probe assemblies 177A and 177B includes a pair of monitoring probes to engage either the pin or the pin head of the substrate, the probes being connected to the Kelvin bridge 30 (see FIG. 1).

Figure 10:
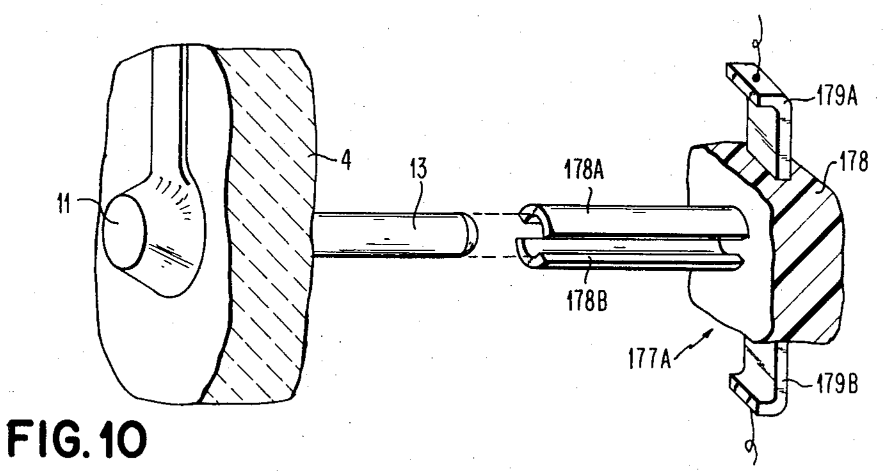
FIG. 10 is a fragmentary perspective view of a portion of the means utilized for monitoring a resistor as it is being trimmed on the pin head side of the substrate.

In the event that the monitoring apparatus is used to monitor the pins by suitable connections to the pins on the substrate, each of the assemblies 177A, 177B has a form similar to that illustrated in FIG. 10. As shown, a socket comprises an insulator 178 which includes a projecting axially split cylinder having upper and lower portions 178A and 178B, the portions being adapted to embrace a single pin such as the pin 13 illustrated in FIG. 1. Each of the semi-cylindrical portions 178A and 178B is insulated from the other by the insulator 178 and is connected respectively to a conductive support 179A and 179B which are connected through the L-shaped angles 176A or 176B (FIG. 6) and insulated therefrom by suitable insulation means. Additionally, the portion 178A of the semicylindrical socket is electrically connected to the support 179A as the portion 178B is electrically connected to the support 179B. The purpose of two electrically isolated connectors is to eliminate, as much as practicable, contact resistance.

Figure 11:
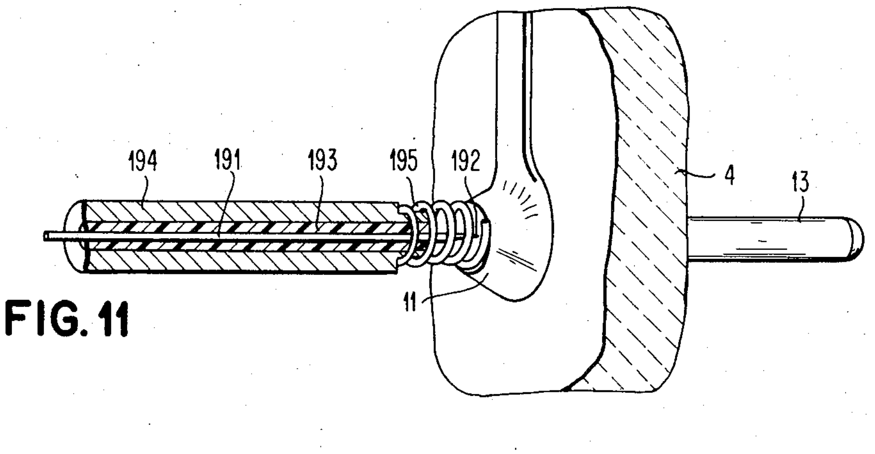
FIG. 11 is a fragmentary perspective view of a portion of the means utilized for monitoring a resistor as it is being trimmed on the pin side of the substrate.

In the event that it is necessary to contact the opposite side of the substrate, i.e. the pin head side, the probe assembly heretofore described may be replaced with the apparatus illustrated in FIG. 11. As shown in FIG. 11, the socket is replaced by a coaxial probe comprising a central conductor 191 including a projecting tip 192 for engagement with a pin head such as the pin head 11. An insulator 193 circumscribes the central conductor 191 to insulate the conductor from an exterior outer conductor 194. As shown the conductor 194 terminates in a flexible spring-winding 195 which may engage the pin head 11 and be compressed to permit intimate contact between the tip 192 and the pin head, as well as to insure a good connection between the outer conductor and the pin head.

Figure 9:
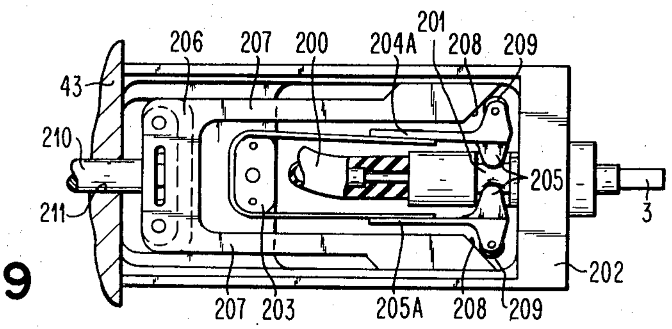
FIG. 9 is a view similar to FIG. 8 but in which the mechanism illustrated is in a second position.

In a manner which will be more fully explained in the section entitled "Abrasion Control Circuitry", at the point where the resistor Ru has reached at a predetermined value, the flow of particulate matter from the nozzle 3 against the resistor is terminated. To prevent overshoot it is desirable to pinch off the flow of particulate matter as quickly as possible and as close to the nozzle as possible. To this end and referring first to FIG. 8 and 9, the nozzle 3 is supplied in a conventional manner with a flow of particulate matter through tubing 200, at least the section 201 of the tubing being flexible for reasons which will become apparent. Interiorally of the nozzle assembly casing 42 and connected to the base 43 of the casing 42 is a housing 202, the housing including cam actuated pinch off means comprising a body portion 203 having axially extending legs 204 and 205 which are connected to the body portion as by outwardly biasing leaf springs 204A and 205A. As illustrated, the legs each have inwardly turned and rounded hammer ends 205 which are aligned on opposite sides of the tubing 201 and adapted, when actuated, to pinch off the grit flow through the tube at the section 201 closely adjacent the nozzle 3. As illustrated also slideably mounted interiorally of the casing are camming means, in the present instance including a base portion 206 and axially extending spaced apart legs 207 which terminate in diverging cam faces 208. On the opposite side of the hammers 205 are rollers 209 which bear against cam faces 208 so that when the cam is moved forwardly the hammers move together as shown in FIG. 9 pinch off the grit flow. It should be noted that the rod 210, which passes through an aperture 211 in the base plate 43 extends coaxially with the stub shaft 88 and also is splined as with pin 183A to a coaxial shaft in the shaft 86. Actuation of the rod 210 may be effected by either a solenoid or a hydraulic actuator, the hydraulic actuator being preferred. Such actuators are mounted in the illustrated instance and as best shown in FIG. 3, at the opposite ends of the actuator means as at 212.

SECOND EMBODIMENT

The preferred embodiment of the In-Line Passive Resistor Trimmer is illustrated in FIGS. 12–38, the machine operating with substantially the same electrical controls as heretofore described so that as the predetermined value of the resistor is approached the nozzle associated with the erosion of the resistor material is slowed down and finally stopped at which time the eroding particle stream is cut off.

Figure 12:
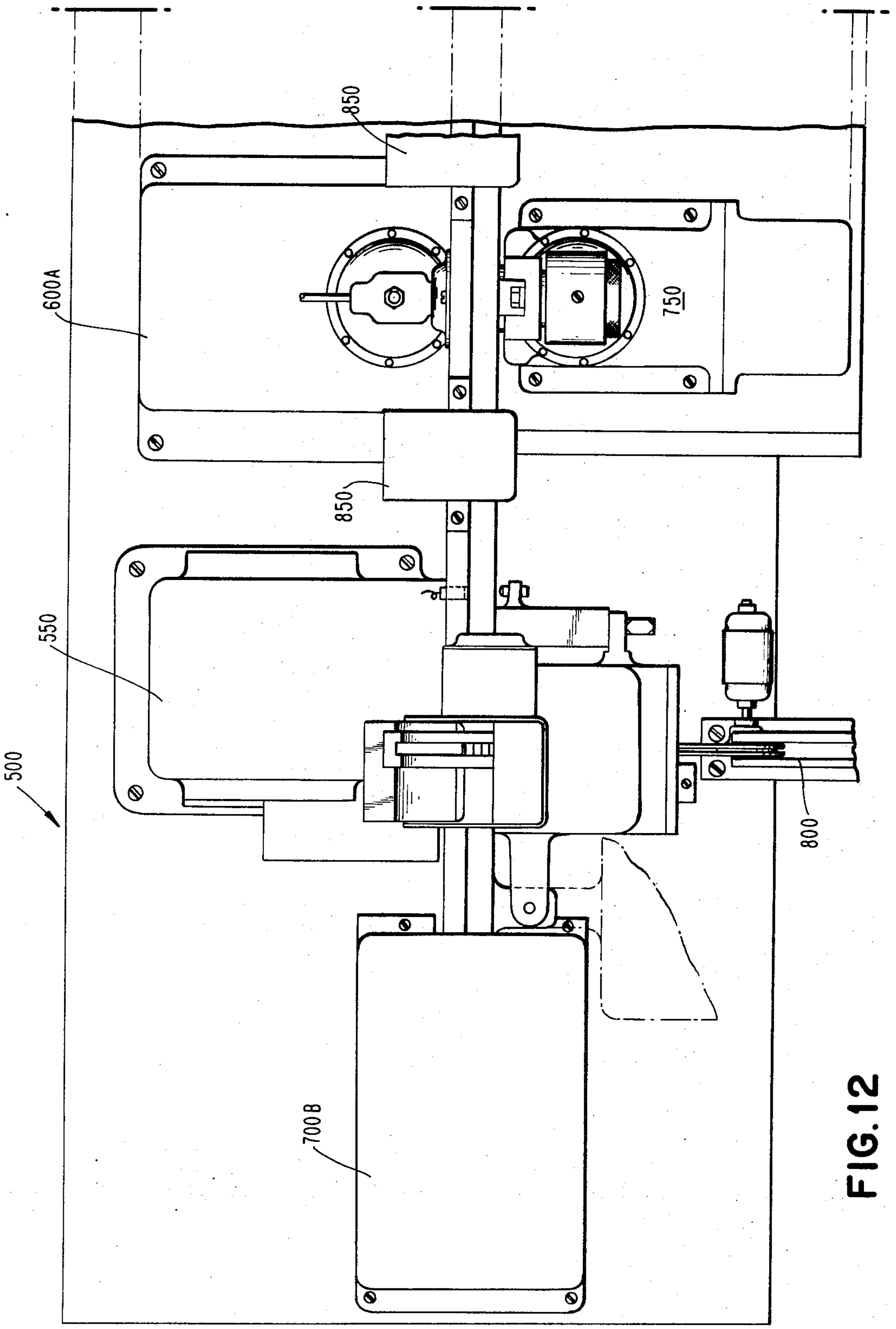
FIG. 12 is a fragmentary plan view of a portion of another embodiment of a trimmer constructed in accordance with the present invention.
Figure 13:
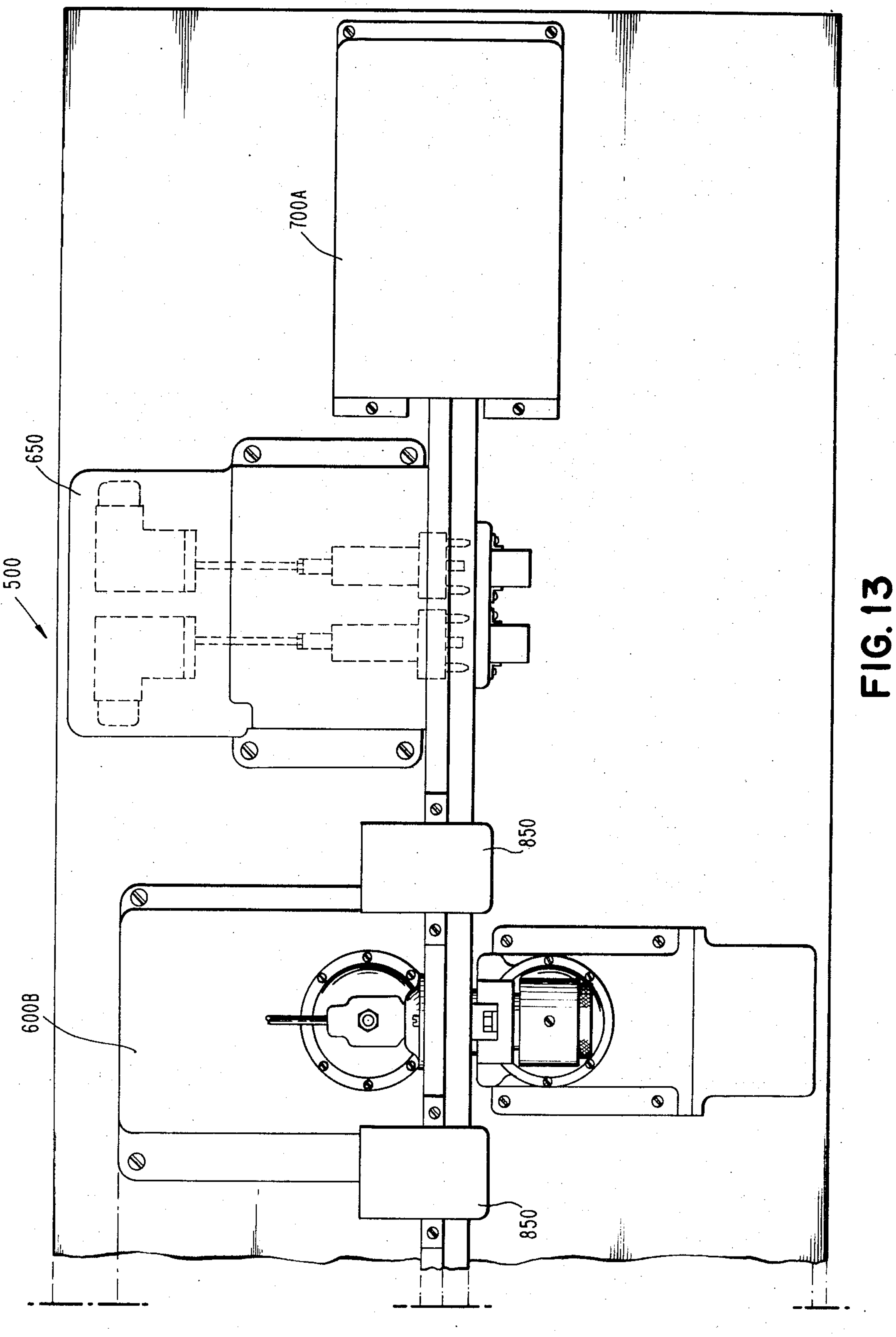
FIG. 13 is a fragmentary plan view of another portion of another embodiment of the present invention, the views in FIGS. 12 and 13 being coextensive.

The overall machine is illustrated in FIGS. 12 and 13 and is adapted for automatically loading and unloading modules or substrates, trimming one or more devices on either side of a substrate at a plurality of serially located positions, and transferring the substrates to the ultimate unload station.

Referring now to the drawings and especially FIGS. 12 and 13 thereof, an automatic resistor trimming machine 500 is shown, the machine comprising a substrate load and unload station and apparatus 550, a plurality of trimming stations 600A, 600B, etc. and a substrate reject station 650. At opposite longitudinal ends of the machine 500 transfer mechanism 700A and 700B operates to transfer modules or substrates from the top of a conveyor to the bottom thereof, or vice versa.

As will be more fully explained hereinafter, in operation substrates are loaded individually into separate carriers which progress on a conveyor from the load station 550 through one or more trim stations 600A, 600B and then into registry with a reject station wherein if a resistor value was initially too high or low and/or had been overtrimmed, the substrate will be rejected. Thereafter the carrier is moved from the upper portion of the conveyor belt onto the lower portion thereof by the transfer assembly 700A and the carrier is indexed into the unload portion of the load/unload apparatus 550, at which time the substrates are unloaded as through a chute mechanism 800.

In the event it is desired to trim resistors on the opposite side of a substrate from that exposed to the nozzle eroding the resist material on the substrate, turn-around apparatus 850 is interposed intermediate each of the trim stations and after the load and unload stations 550 and before the reject station apparatus 650. In this manner, assuming the conveyor is moving from left to right in FIG. 12, the appropriate side of the substrate will be facing the trim apparatus at the trim station. Thus the carrier turn around station eliminates the necessity for reversing the trim assembly and monitoring head, such as required in the embodiment illustrated in FIGS. 1–11.

CONVEYOR AND CARRIER

Figures 14, 15, 17, 18:
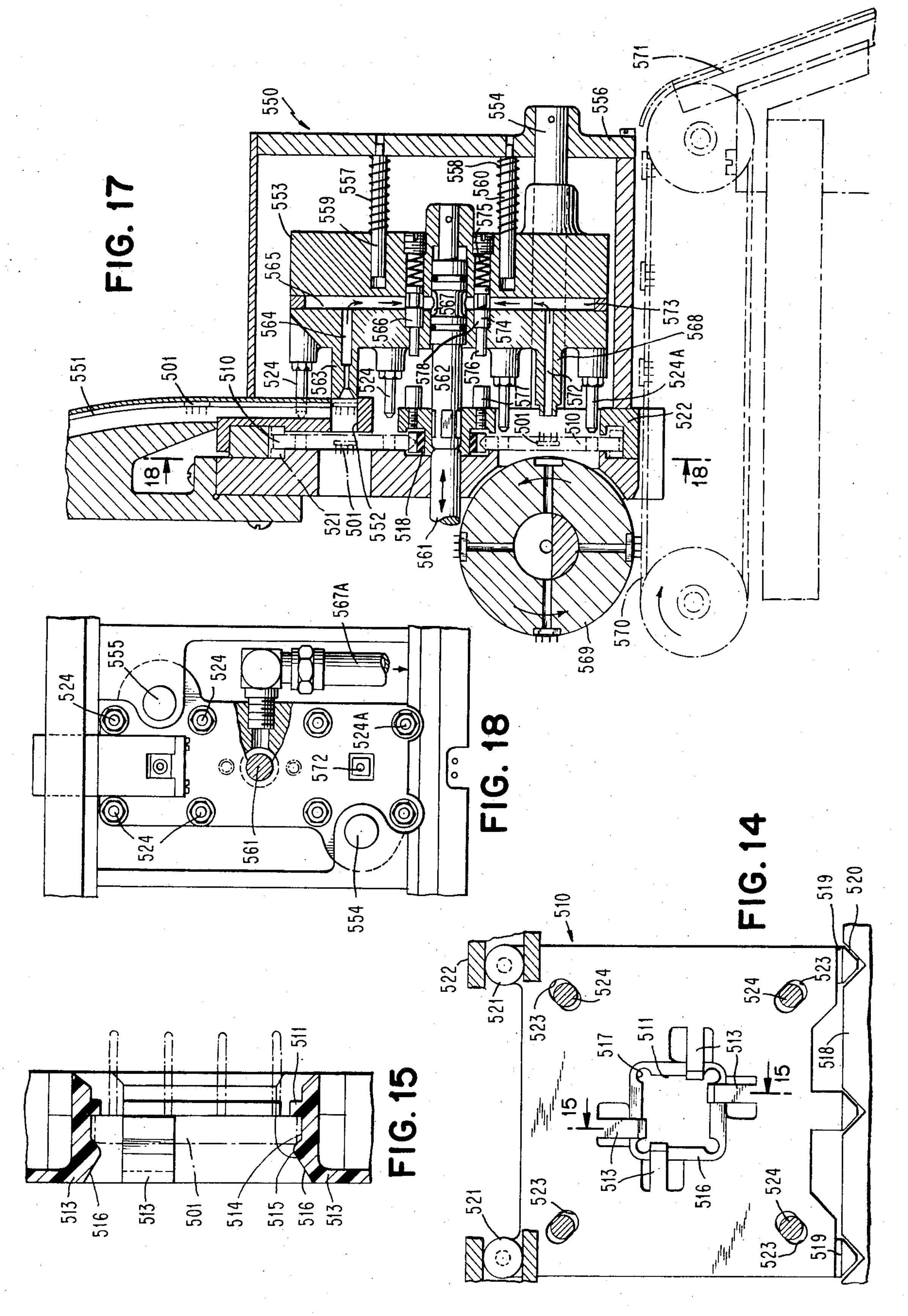
FIG. 14 is a fragmentary side elevational view of a typical carrier for holding the substrate in a machine constructed in accordance with the present invention.
FIG. 15 is an enlarged fragmentary sectional view taken along line 15—15 of FIG. 14.
FIG. 17 is a fragmentary sectional view of the substrate load and unload station illustrated in FIG. 12.
FIG. 18 is a sectional view taken along line 18—18 of FIG. 17.

In order to properly trim components on a substrate such as the substrate 501 illustrated in FIG. 15, it is preferable to provide means for holding the substrate in a preset, predetermined position relative to the nozzle so as to permit more accurate centering of the substrate relative to the nozzle and to permit application of particulate matter against the substrate without jamming of the substrate and associated conveyor mechanism.

To this end and referring to FIG. 14, a molded carrier 510 composed of a resilient material, for example polyurethane, includes a central cavity or opening 511 in which a substrate or module 501 may be mounted. On at least opposite corners of the cavity 511 are inwardly extending flexible ears 513 which cooperate with the cavity 511 to overlie the same, as well as overlying a circumferentially extending ridge 515 situated above a recessed pocket 514 which holds the substrate in the cavity. To facilitate entry and removal of the substrate into and out of pocket 514, the leading or forward portion of the cavity 511 is provided with a chamfer 516 which extends about the periphery of the cavity, the chamfer providing maximum clearance for entry of trim nozzles, contact probes and the like into a position adjacent a surface of the substrate. Additionally, the chamfer compensates for any slight misalignment of the substrate for entry into the recessed pocket 514. Inasmuch as the carrier 510 is composed of a resilient material, pushing the substrate 501 against the ears permits the substrate to snap into the pocket 514 past the ridge 515 with the ears overlying the corners, in the present instance two of the corners of the substrate. As illustrated in FIG. 14, entry and egress of the substrate is also facilitated by apertures 517 located at the corners of the cavity 511, which apertures serve to relieve the sharp corners and enhance the flexibility of the ridge 515.

The carriers 510 are moved from station to station via a cog belt carrier 518 schematically illustrated in FIG. 14, the carrier 510 including depending and tapered, longitudinally spaced apart teeth 519 which coact with slots 520 in the cog conveyor 518. To stabilize the carrier as it moves from station to station, the carriers are provided with rollers 521 at the upper portion thereof to permit registry of the rollers with a longitudinally extending track 522.

Means are provided for centering each carrier 510 as it enters a work station so as to precisely position the substrate 501 at a predetermined home position. To this end, and as best shown in FIG. 14, the carrier is provided with a plurality of slots 523, a pair of slots being located on each diagonal of the carrier 510 for registry with locating pins 524 which move into and out of registry with the slots 523 at each of the work stations.

Figure 16:
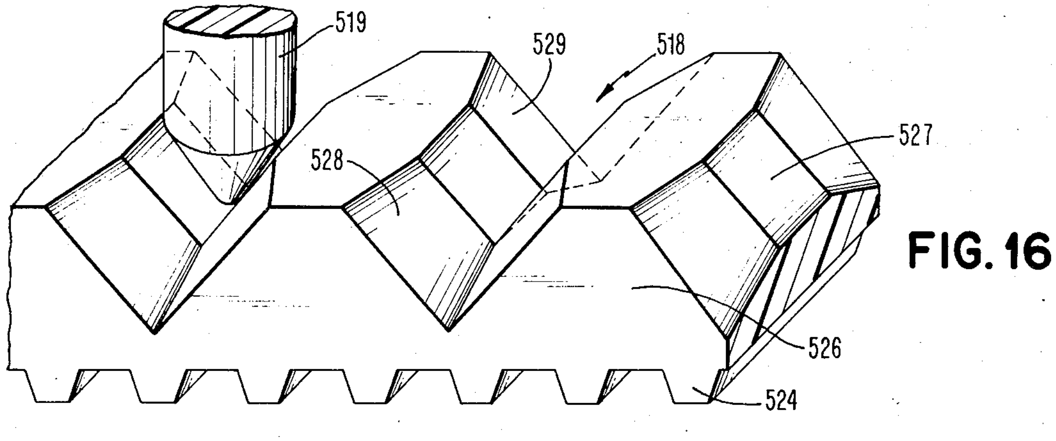
FIG. 16 is an enlarged fragmentary sectional view of a portion of the conveyor illustrated in FIG. 14.

Inasmuch as the cog belt conveyor 518 is of special design to facilitate proper transport of the carrier 510 and to permit, at the turn around stations, proper orientation of the substrate held by the carrier, i.e. front or back, an enlarged fragmentary version of the conveyor 518 is illustrated in perspective in FIG. 16. Referring to that drawing, the conveyor 518 comprises driving studs 524 which depend from the carcass of the conveyor for engagement with a drive sprocket or the like (see FIG. 19 and the phantom-lined sprocket 525) which moves the belt or conveyor 518 in a linear path transporting the carrier 510 with it. As shown, the conveyor includes upstanding lugs 526 having sloped leading and trailing face portions 527, each of the face portions having relieved side beveled edge portions 528 and 529. The relieved side beveled edge portions facilitate rotation of the carrier about the central tooth 519 which will be explained with relation to FIG. 21 hereinafter.

SUBSTRATE LOAD AND UNLOAD

As heretofore described, the substrates 501 are individually loaded into separate carriers 510, the carriers being serially conveyed thereafter through the trimming stations, the reject station and then back via transfer mechanism to be unloaded. To this end and as best illustrated in FIGS. 17 and 18, a plurality of substrates 501 are positioned in a chute 551 and by gravity fall into a receptacle 552 for registration with a head 553 which transfers a substrate from the receptacle into the cavity 511 associated with the carrier 510. Upon retraction of the head 553 a new substrate is unloaded into the receptacle and the carrier is indexed out of the load position bringing an empty carrier into the load position via the cog belt conveyor 518. The head 553 is supported on a pair of shafts 554, 555 (FIG. 17 and 18) as by ball bushings for reciprocation of the head along the shafts. The shafts are supported by a frame 556 carried by the base of the machine 500. As illustrated, the head is biased forwardly, i.e. towards the left in FIG. 17 by biasing springs 557, 558 mounted on shafts 559 and 560. Actuation or reciprocation of the head 553, during dwell portions of the conveyor indexing, is caused by a reciprocating drive shaft 561 which abuts the shaft 562 which is pinned to the head 553.

As the head moves forward, i.e. to the left in FIG. 17, locating pins 524 mounted on the forward portion of the head 553 register with the slots 523 in the carrier 510 centering the carrier so as to permit positioning of the substrate 501 into the cavity 511 in the central portion of the carrier. As illustrated, upon the substrate falling into the receptacle, registration occurs with a plunger 563 centrally located in the upper portion of the head 553, the plunger 563 having a vacuum thereon for holding the substrate for entry into the carrier. As illustrated, a vacuum is drawn through passageway 564, 565, past a cutoff valve 566 and through a recessed annular cavity 567 circumscribing the shaft 562 in the head 553. Vacuum is applied to the annular recessed portion of the shaft as through the line 567A (FIG. 18).

In order to unload substrates fro the carriers, the lower portion of the head is adapted to register with carriers 510 which are moving along the bottom of the conveyor 518, the loading and unloading adapted to occur simultaneously thus simplifying the station. To this end, the lower portion of the head 553 is identical to the upper portion, the lower portion of the head including locating pins 524A also adapted to register with the slots 523 of the carrier so as to precisely position the carrier relative to a plunger 568 which pushes the substrate 501 out of the carrier onto a rotary vacuum conveyor 569 which deposits the substrates onto a belt conveyor 570 for depositing the substrates through a chute 571 for ultimate use in printed circuit cards and the like. As illustrated the plunger 568 draws a vacuum through a passageway 572, 573 through a vacuum shutoff valve 574 and into the annular recess 567 associated with the shaft 562. The vacuum shutoff valves 566, 574 are each biased into the normally open position as by a biasing spring 575 so as to permit the vacuum to be drawn through the associated passages. As the head moves forward the substrate is engaged by the plunger 568 and is held onto the plunger by the vacuum. Upon the dislocation of the substrate 501 from the cavity 511 (in the unload station) and abutment of the substrate against the periphery of the rotary conveyor 569, one end 576 of the vacuum shutoff valve has engaged a stop 577 overcoming the biasing spring 575 and causing the spool 578 of the valve to register and close off passageway 573 thereby shutting off the vacuum and permitting the substrate 501 to be transferred from the plunger 568 to the rotary indexing mechanism 569. In a like manner the vacuum valve 566 may be used to release the vacuum on the plunger 563 upon entry of the substrate 501 into the cavity 511 of the carrier 510.

Thus substrates are loaded into and unloaded from carriers 510 simultaneously always insuring a fresh supply of carriers for substrate loading. With the type of rotary vacuum carrier used it is important that the substrate be positioned with its flat side or pin head side towards the rotary conveyor when it is unloaded. This insures proper action of the vacuum and pickup of the substrate.

CARRIER TURNAROUND

Figure 21:
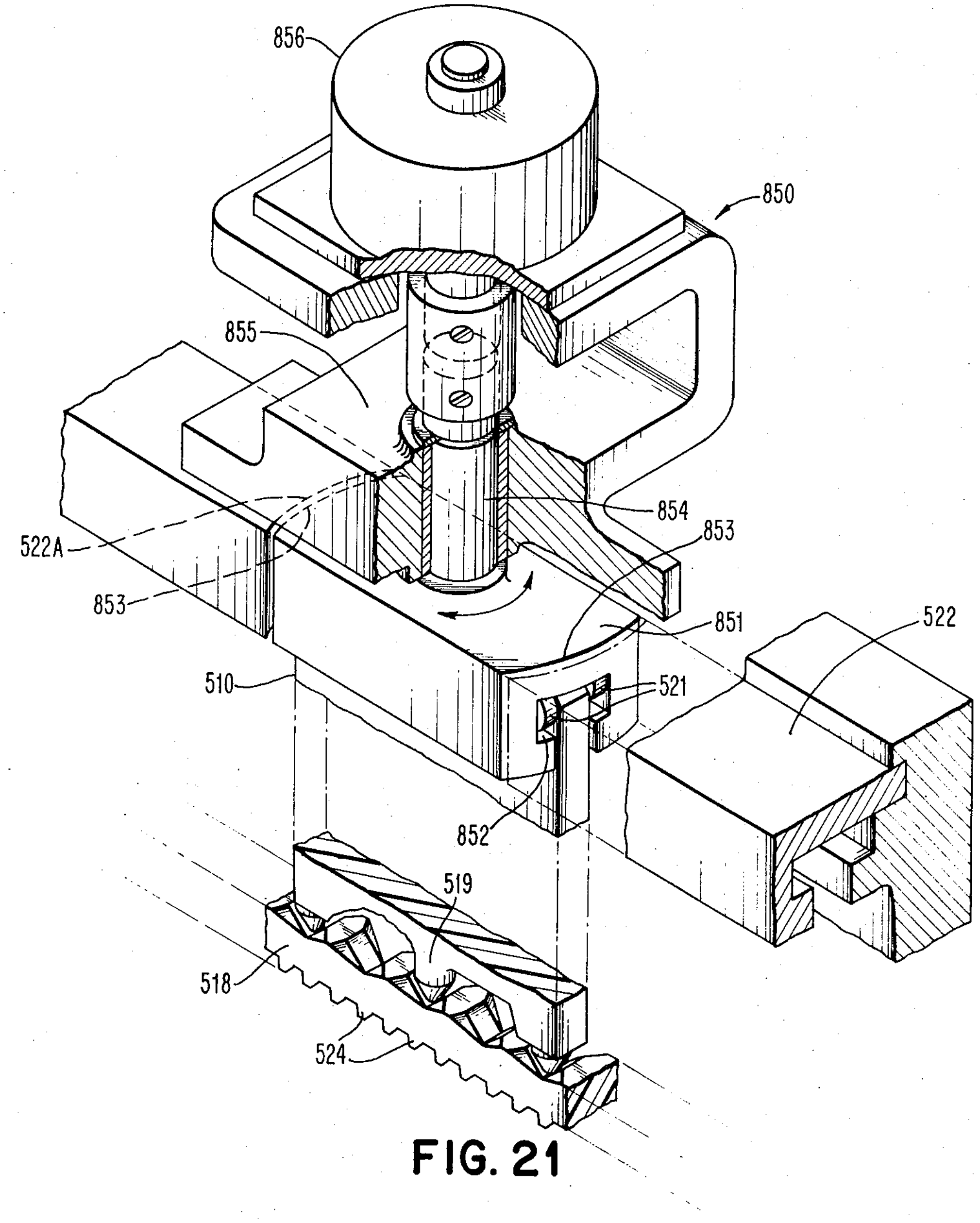
FIG. 21 is a fragmentary perspective view of apparatus for rotating the carrier illustrated in FIGS. 14 and 15 to enable trimming resistors on the reverse side of the substrate.

In order to present the proper side of the substrate to the first trim station, the carrier may have to be reversed prior to entry thereof into the first trim work station. To this end and as best illustrated in FIG. 21, each turnaround station includes a turnstile 851 which forms a portion or a segment of the track 522 in which the rollers 521 of the carrier 510 ride. The turnstile includes track means 852 coextensive with the track 522 and including convex end portions 853 which register with concave track portions 522A. The turnstile is rotatable supported by an upstanding shaft 854 which is bushed in a holder 855 connected to the frame of the machine. As illustrated, turnstile drive means 856, in the illustrated instance a rotary air motor or cylinder is connected to the shaft 854 so that upon the receipt of the necessary signal, the turnstile is rotated 180° (see the arrow on the turnstile) so as to present either the front (pin-head side) or reverse (pin side) of the substrate to the succeeding workstation.

As the turnstile rotates, the central tooth 519 of the carrier acts as a pivot for the carrier, the bevelled side edge portions 529 associated with the cog belt 518 providing the necessary clearance for the adjacent teeth on the carrier to clear the belt during exit and entry of the teeth.

TRIM APPARATUS

As the conveyor 518 indexes through the turnaround 850, it comes into registry with the first trim station 600 wherein the carrier is held as by locating pins 524 associated with the trim station and the nozzle is positioned for cutting erosion portions of the material on the substrate. Simultaneously with the cutting action the substrate is monitored so as to insure proper deacceleration of the nozzle and timed shutoff of the flow of abrasive particulate matter. To this end and referring first to FIGS. 22 – 25 a nozzle 601 is mounted in a mounting block 602 capable of motion in the X, Y, and Z planes. As illustrated the nozzle extends, when in a cutting position, closely adjacent the substrate 501 carried by the carrier 510. A cup-shaped diaphragm 603 shields the nozzle block 602 from the particulate abrasive matter while permitting movement of the nozzle block 602 for retraction of the nozzle in a manner which will be more fully explained hereinafter. As illustrated the block includes a chamber 604 housing an anvil 605 and a ram 606, the ram being hydraulically actuable for engagement against a flexible portion 607 of the nozzle to cut off particulate matter flow at a predetermined time closely adjacent the exit point of the nozzle. It is important that the shutoff be hydraulically actuated for faster response and that it be located as close as possible (without interference) to the terminal end of the nozzle.

Figure 23:
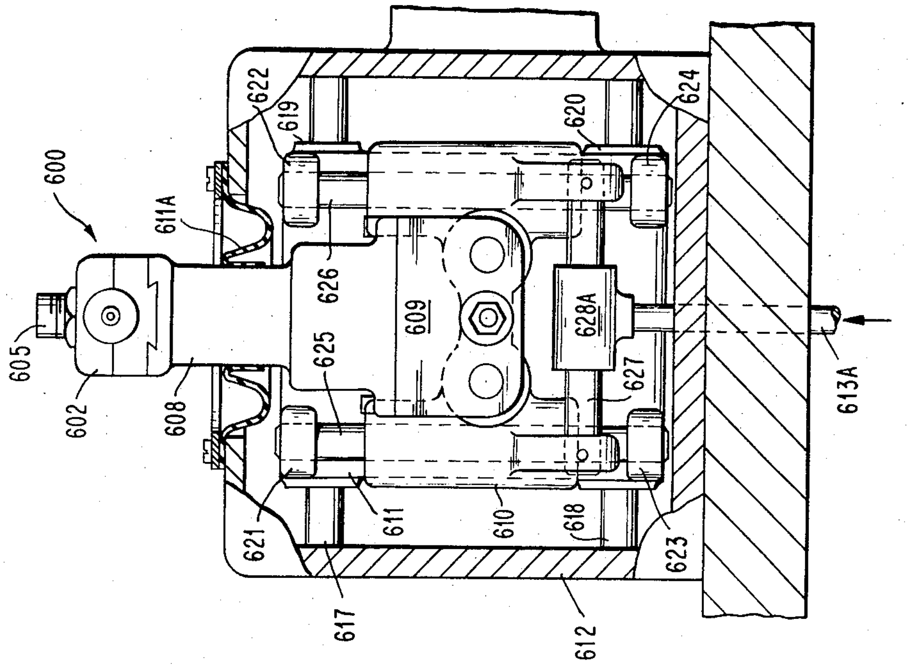
FIG. 23 is a front elevational view in section and with portions of the apparatus removed to best illustrate parts of the X–Y positioning mechanism constructed in accordance with the present invention.

In order to effect X, Y, and Z motion to the nozzle block 602, with the precise requirements of nozzle position necessitated by very small resistors, etc. on the substrate, novel actuator means are provided. To this end and as illustrated in FIGS. 22 – 25, the nozzle block 602 is connected through a post 608 to a first casting 609 which is slidably disposed on a second casting 610 which in turn is connected to a subcasting 611. A flexible diaphragm 611A shields the castings from any particulate matter while simultaneously permitting movement of the nozzle block 602. As illustrated the castings 609, 610 and 611 are disposed in a housing 612 with suitable apertures 613, 614 and 615 to permit entry into the housing of actuator means. Supporting the castings in the housing 612 is support means comprising in the present instance a pair of horizontally extending shafts 617 and 618 respectively, the shafts extending through ball bushings 619 and 620 and being connected at their ends to the housing 612. The ball bushings are connected to and form the subcasting 611 connected to the second casting 609. Extending from the subcasting 611, in the present instance ball bushing 619, are projections 621 and 622, and from ball bushing 620 projections 623 and 624. Vertically disposed between projections 621 and 623 and pinned thereto is a first rod member 625 while vertically disposed between projections 622 and 624 is a second rod member 626. As illustrated in FIG. 23 the second casting 610 is slidably disposed as preferably by ball bearing slides on the rods 625 and 626.

In order to effect reciprocable movement to the second casting 610, via the rod 625 and 626, a horizontally extending shaft 627 is slidably connected to a tee 628A which in turn is connected to an actuator rod 613A. Even though the first casting 609 is movable with respect to the second casting 610 the vertical support for the first casting is supplied by the second casting and inasmuch as the post 608 supports the nozzle block 602, "Y" motion of the nozzle block is effected by movement of the actuator 613A.

Figure 25:
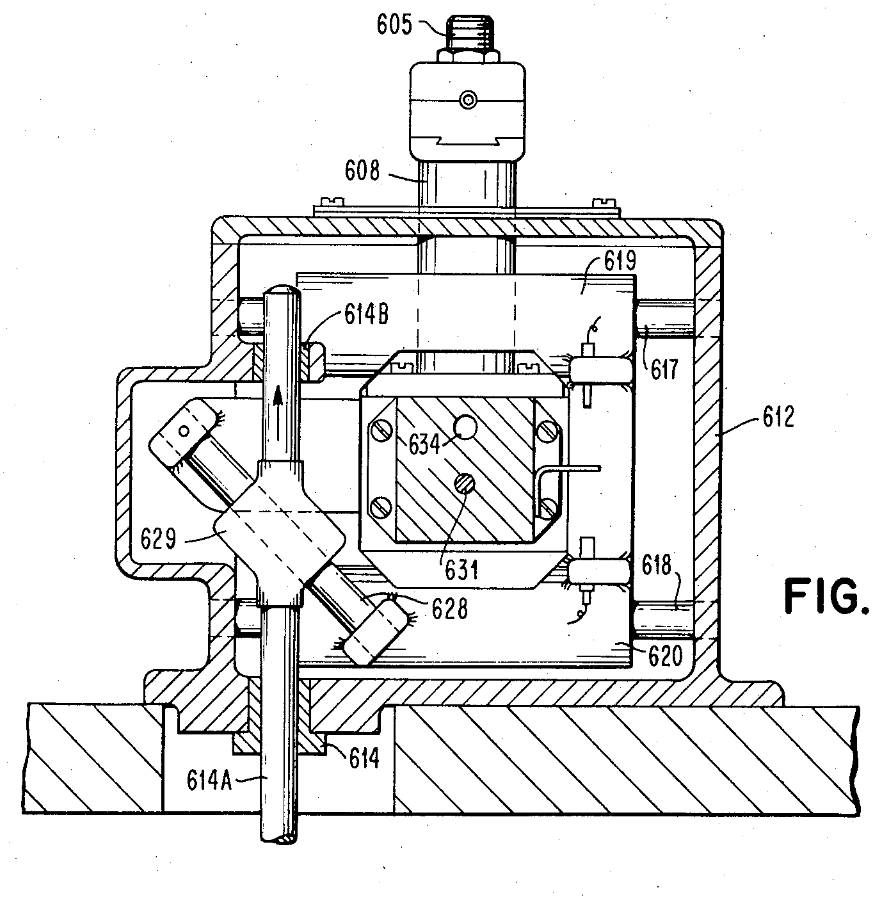
FIG. 25 is a fragmentary sectional view taken along line 25—25 of FIG. 22.

In order to effect in and out of the paper motion (reference FIG. 22) or left to right motion (reference FIG. 23) means are provided for sliding the subcastings 611 and thus the bosses 619 and 620 along the rods 617 and 618 thereby permitting or effecting movement of the second casting 610 via the rod 625, 626. To this end, and as best illustrated in FIG. 25, a guide rod 628, connected to the subcasting 611, is positioned at a 45° angle relative to the horizontal plane and is coupled to an actuator rod 614A as by a ball bushed sleeve 629, the actuator passing through the sleeve but connected thereto and resting in upper and lower bushings 614B and 614C. Inasmuch as the sleeve 629 is connected to the actuator 614A, upward vertical movement of the actuator 614A causes the sleeve to move upwardly along guide rod 628 thereby causing the bushing 619 and 620 to move along the shafts 617 and 618. In a like manner downward movement of the sleeve 629, caused by lowering the actuator 614A, causes the second casting to move in the opposite direction, that is, looking at FIG. 25 to the left. In this manner motion is imparted to the first casting 609 and thus the post 608 in a direction perpendicular to the vertical.

Figure 22:
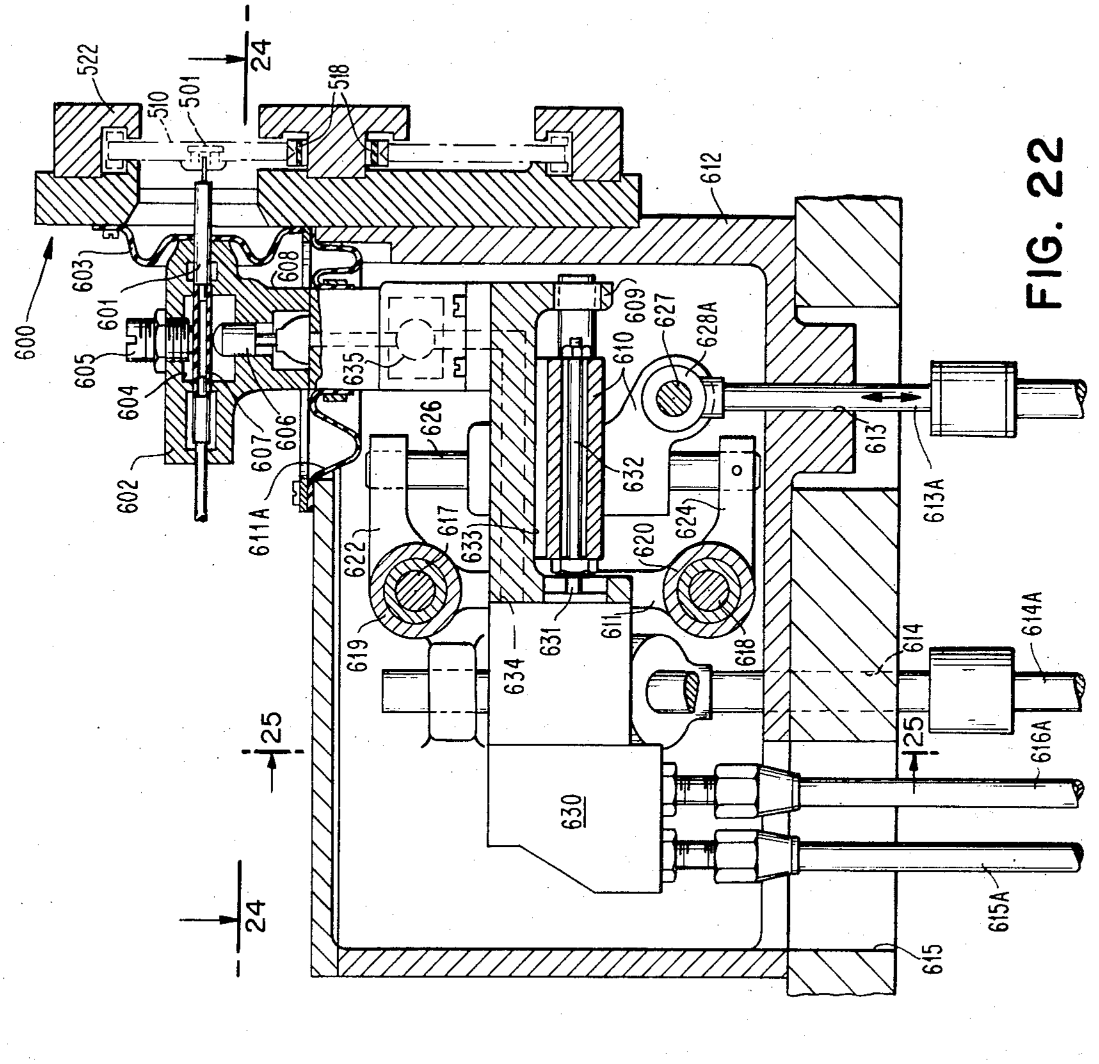
FIG. 22 is a fragmentary side elevational view of a portion of a trim station illustrated in FIGS. 12 and 13.

The Z motion or in and out motion of the nozzle 601 is effected by simple hydraulic pressure, the hydraulic lines 615A and 616A being connected into a chamber 630 in the first casting 609, and including a piston 631, one end of which abuts and is connected to a stop screw 632. Inasmuch as the second casting is rigid with regard to left to right motion (reference FIG. 22) by the shafts 617 and 618, hydraulic pressure build up against the piston 631 will cause the first casting 609 to move or slide along the surface 633 relative to the second casting 610. Conversely reversal of pressure will cause the first casting 609 to move to the right until the position it reaches as illustrated in FIG. 22.

For economy of space, a drilled hole 634 may extend from the chamber 630 through the first casting 609 and connect to a servo valve 635 for actuation at a desired time of the hammer 606 for pinching off the nozzle and thus the flow of particulate matter.

SUBSTRATE MONITORING APPARATUS

In order to determine the value of the device prior to its being trimmed, and while it is being trimmed it is necessary that means be provided for monitoring the substrate and devices thereon regardless of which said of the substrate is being trimmed. Additionally, it is desirable to provide with the monitoring means, means for engaging and post trimming disengaging the carrier 510 and to permit indexing of the cog belt conveyor 518 and for registration of the next carrier 510 at the trimming station.

Figure 26:
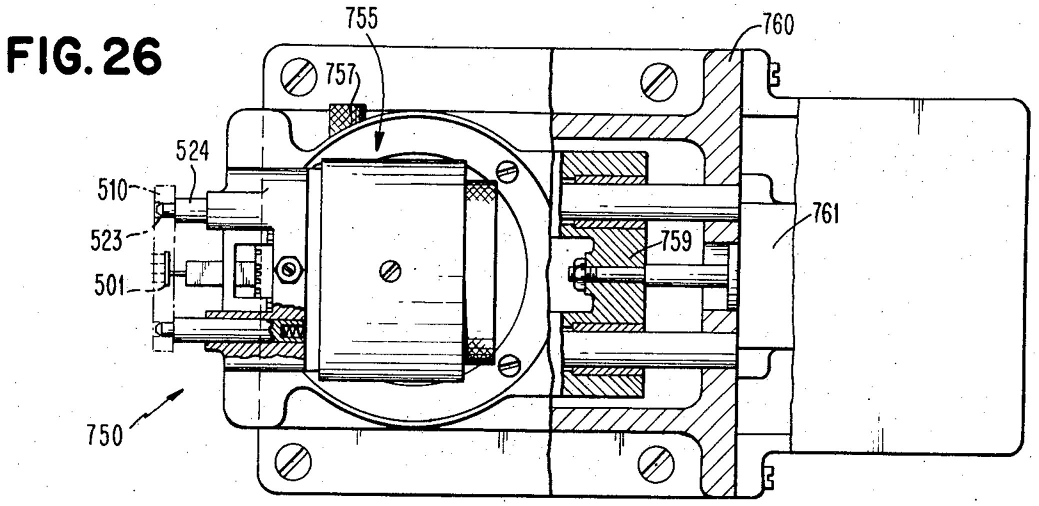
FIG. 26 is a fragmentary plan view of a portion of the apparatus constructed in accordance with the present invention and associated with the trim station for making electrical contact with one side of the substrate held by the carrier.
Figure 27:
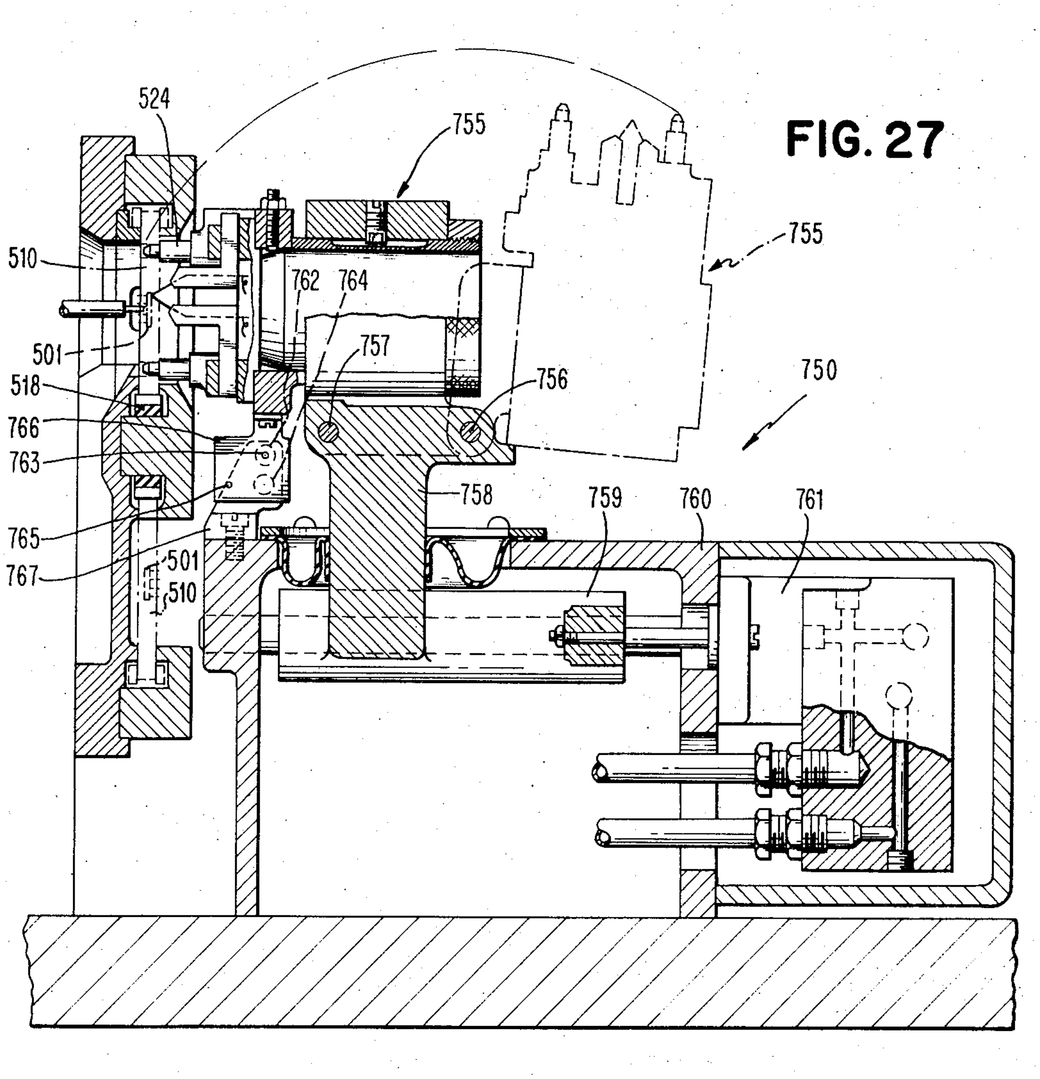
FIG. 27 is a fragmentary sectional view in side elevation of the apparatus illustrated in FIG. 26 and illustrating in dash lines the clearance position of a portion of that apparatus.

To this end and referring first to FIGS. 26 and 27, the monitoring apparatus 750 which includes a monitoring head 755 is mounted for horizontal reciprocation so as to permit engagement and disengagement by locating pins 524 with the slots 523 associated with the carrier 510 upon the carrier moving into the trim station. As shown in FIG. 27, the head 755 is pivotally mounted as at 756 and is held in position (full line) by catch means 757. The head is mounted on an upstanding post 758 which is connected to slide means 759 mounted in a subframe 760 which is connected to the main frame of the machine. The slide 759 is connected to conventional hydraulic mechanism 761 to effect reciprocation of the slide and thus the head at predetermined times.

To insure proper location of the head for monitoring and for abrasion of resistors, while insuring that the head is free of the carrier and it is safe to index the conveyor 518, photo cell means 762 and 764 are positioned on an upstanding flange 767 connected to the subframe 760 so as to align with apertures 763 and 765 respectively in a depending flange 766 connected to the monitoring head 755 when the head 755 is in the monitoring position and when in the retracted position. As shown the aperture 763, in a depending flange 766, is aligned with the photo cell 762 permitting light to enter the photo cell and indicating that the locating pins 524 have engaged the slots in the carrier 510. As the head is retracted, the photo cell 764 will align with the pin hole 765 indicating, in a conventional manner, that the carrier is free for indexing. The photo cells are connected via conventional circuitry to effect machine shut off if the simple home position or indexing position photo cells are not properly aligned with the respective apertures either prior to trimming or post trimming.

As may easily be seen, it is necessary that the monitoring apparatus be modified depending upon whether the machine is to monitor the pin side or the head side of the substrate. To this end when the head is in the retracted position the catch means 757 may be released and the head pivoted upwardly as shown in phantom lines to permit substitution of different contact assemblies. Additionally, even if the same side of the substrate 501 is being worked upon by the nozzle, it may be necessary to modify the position of the monitoring contacts so as to monitor another device as it is being trimmed. Thus the swingout arrangement of the monitor head 755 facilitates adjustment of contact position, as well as replacement of the monitoring head when substrate side to be trimmed is altered.

Figure 24:
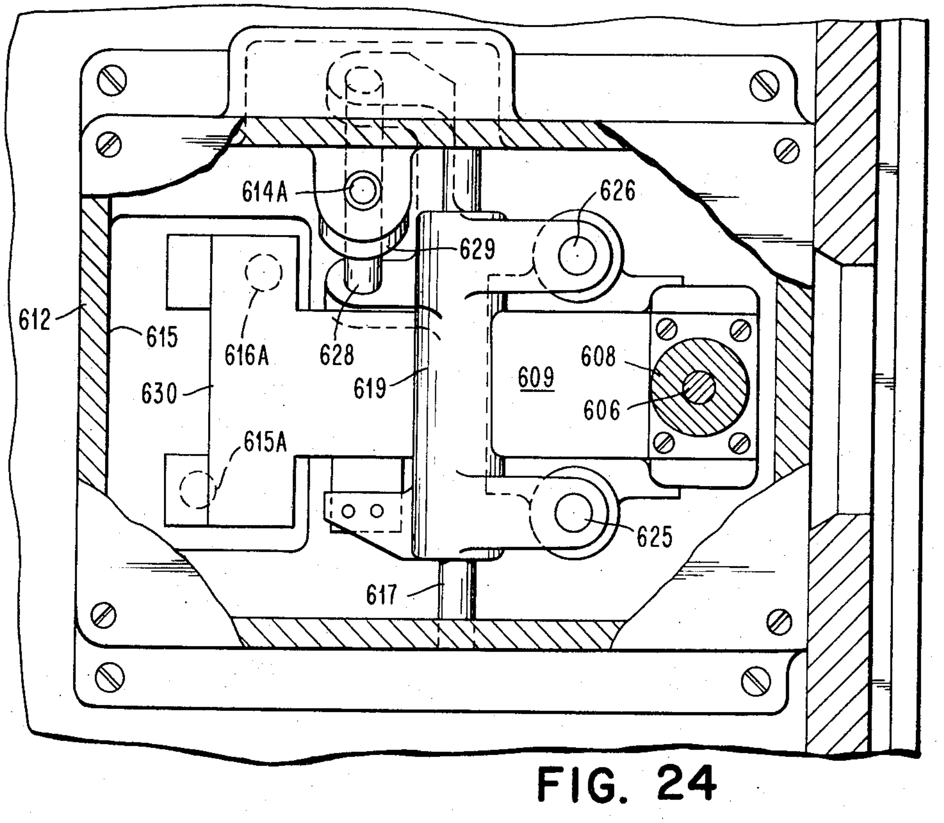
FIG. 24 is a fragmentary sectional view taken along line 24—24 of FIG. 22.
Figures 28, 29, 30:
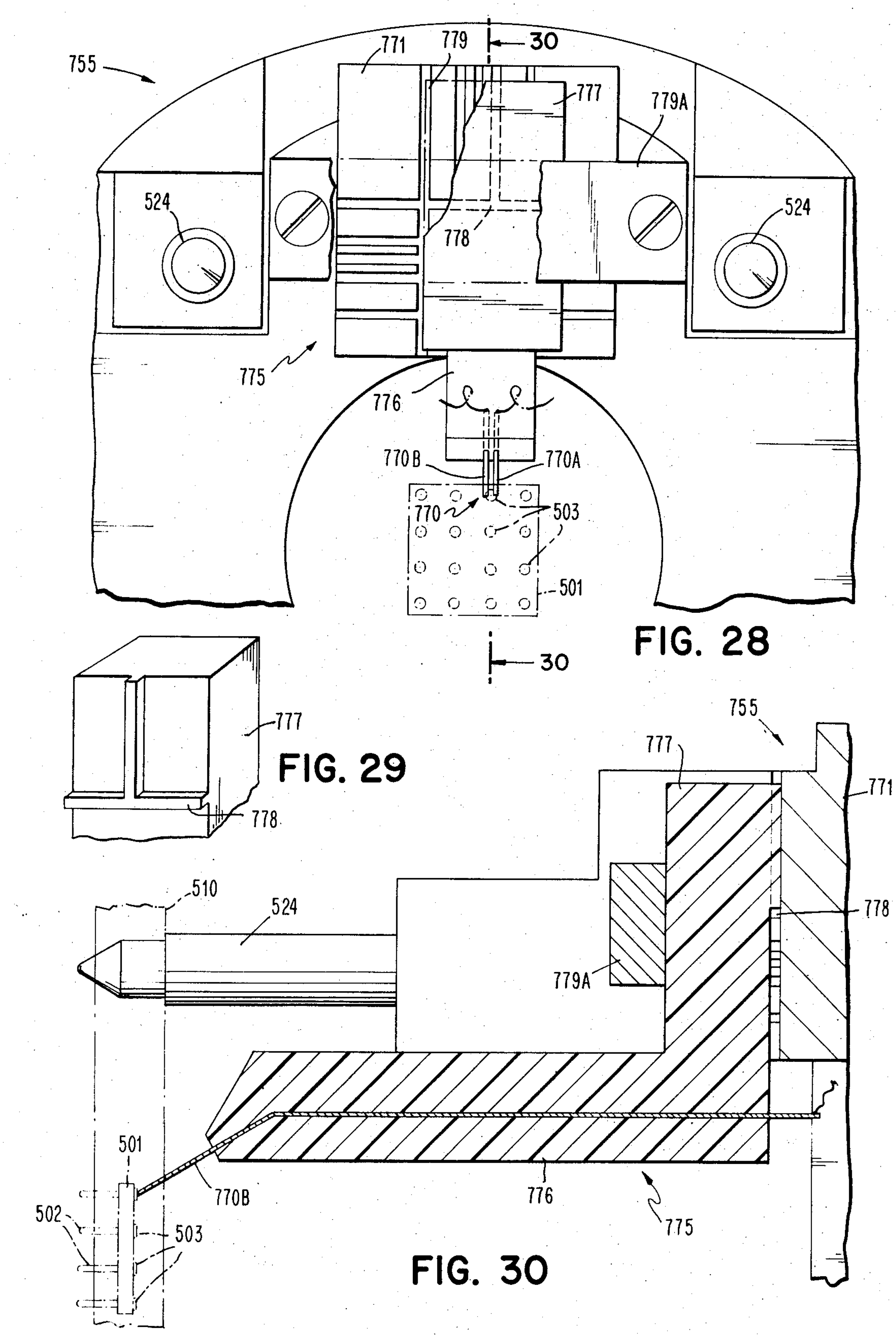
FIG. 28 is an enlarged fragmentary front elevational view of a portion of the apparatus for making intimate electrical contact with one side of the substrate, portions of the apparatus being removed for clarity.
FIG. 29 is a fragmentary perspective view of a portion of the apparatus illustrated in FIG. 28 and for programming the contacting of one of the plurality of contact points on one side of the substrate.
FIG. 30 is a fragmentary sectional view taken along line 30—30 of FIG. 28.

Referring first to the contact or monitoring assembly used when trimming is to be conducted on the pin side of the substrate, as best shown in FIGS. 28–30 a module 501 having a plurality of projecting pins 502 is positioned in the carrier 510 in the cavity heretofore described relative to FIG. 24. As shown, and as is conventional practice, the pins 502 pass through the substrate 501 and terminate in pin heads 503 on the reverse side of the substrate. The locating pins 524 heretofore described have engaged the carrier 510 and positioned the carrier relative to not only the nozzle 601 but relative to the monitoring head 755. In the illustrated instance Kelvin-type contacts or probes 770A and 770B are utilized to insure proper monitoring of a particular pin head 503 (see FIG. 28). Referring first to FIG. 28, the pin head side contacting apparatus includes a locating pad 771 which is secured to the head by any convenient means. Adjustably connected to the locating pad 771 is a contact housing assembly 775 which includes a horizontally extending portion 776 in which is embodied the probes 770 (770B, 770A). The upstanding portion 777 of the contact housing assembly has a T-shaped protrusion 778 (FIG. 29) which is adapted for registration with a waffle-like grid 779 on the face of the pad 771. In this manner, the placement of the T-bar 778 into the proper horizontal and vertical grid coordinates permits the probes 770 to intersect the substrate 501 at a predetermined pin location. As shown, after positioning of the contact housing assembly in its proper predetermined position a clamp 779A may be utilized to secure the assembly to the head.

It should be recognized, and as shown schematically in FIG. 27, two such assemblies including locating pads and contact housing assembly must be utilized to properly monitor a substrate both prior to and during the trimming operation. That is a second set of contacts must be used to contact another of the pin heads 503 to complete the monitoring circuit.

Figure 32:
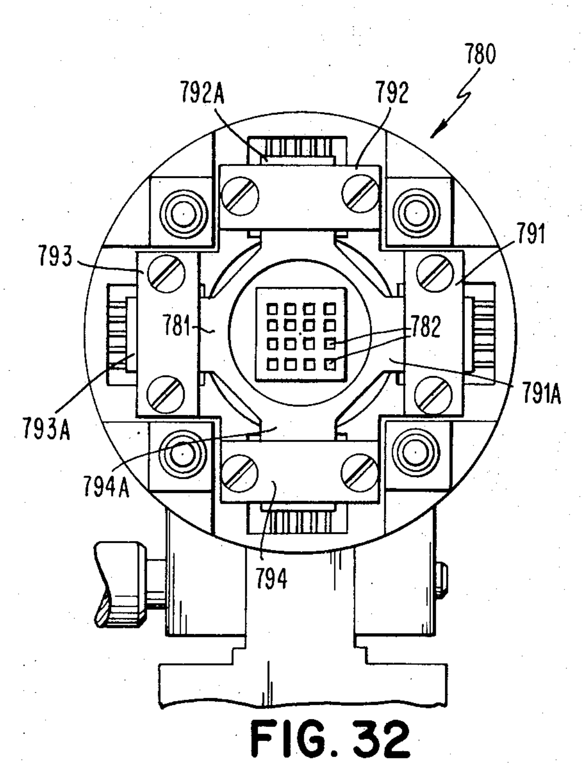
FIG. 32 is a front elevational view taken along line 32—32 of FIG. 31 and with a portion of the apparatus removed for clarity.
Figure 31:
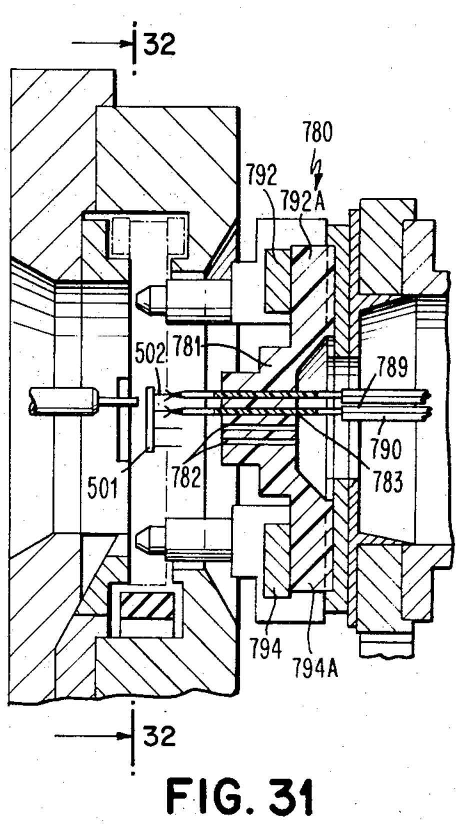
FIG. 31 is a fragmentary side elevational sectional view of a portion of a contact assembly in which the reverse side of the substrate may be monitored.
Figure 33:
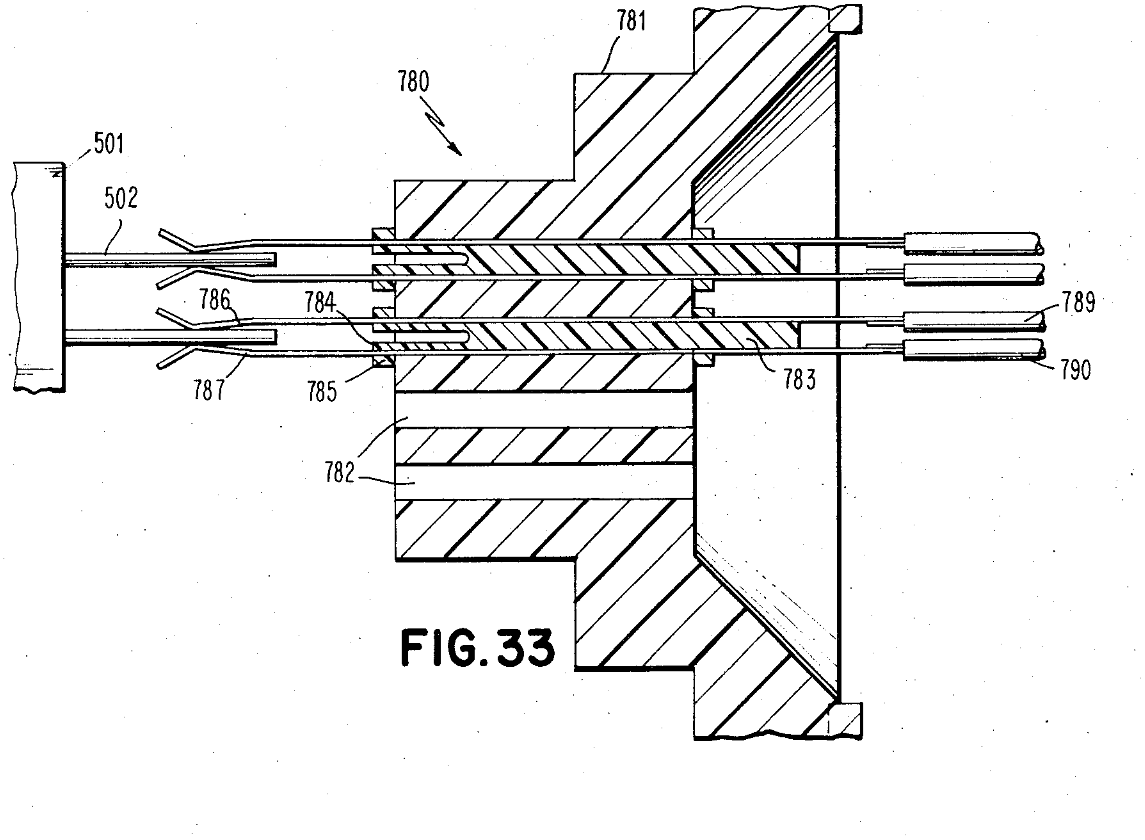
FIG. 33 is an enlarged fragmentary sectional view of the monitoring apparatus shown in FIG. 31.

When the module is reversed, that is , the nozzle is to cut devices on the reverse side (pin side) of the substrate 501, it is necessary to move the monitoring head to its upright position (phantom line in FIG. 27) and substitute a pin side contact assembly 780. To this end and as illustrated in FIGS. 31–33, the pin side contacts 780 includes a probe housing 781 having a plurality of horizontally extending passages 782 therethrough, the passages being positioned in a grid shape corresponding preferably to at least the number of pins 502 on a module 501. A plug 783 having a bifurcated end 784 with lips 785 has a pair of horizontally extending leaf springs 786 and 787 disposed on opposite sides of the plug 783, extending horizontally outward from the housing 781 and converging to meet at a point spaced from the housing. The leaf springs 786 and 787 are separated by the plug which is preferably composed of an insulator, the lips 785 serving to prevent the plug from being pushed back through the passage 782 and thus displaced from the housing upon the pins 502 associated with the substrate or module 501 intersecting the merging point of the leaf springs 786 and 787. As shown the leafs are connected via clip-on type wires 789 and 790 to provide a Kelvin-type measurement.

To facilitate removal of the plugs 783 from the passages 782 while permitting easy programming of the housing 781 so that the probes may be easily positioned to contact any one of a plurality of pins 502 on the module, the lips 785 associated with the bifurcated end 784 of the plug 783 are merely displaced or squeezed together the bifurcated end 784 acting as a spring. This releases the plugs and permits them to be retracted through the passage 782 and reinserted in another passage for contact with another pin.

As illustrated, the probe housing 781 is secured to the head 755 as by clamps 791–794 which pass over ears 791A–794A on the probe housing 781. The ears have protrusions on the backside which register with slots in the waffle-like grid 779 of the pads 771 (see FIGS. 28 and 30).

REJECT ASSEMBLY

In the event that the device on the module being trimmed has an excessively high initial resistance or value or has been overtrimmed at any one of the trim stations, it is necessary to remove the substrate having the defective device thereon so that good product is not mixed with bad product. To this end and referring to FIGS. 34 and 35, the reject station 650 includes a housing 651 which is connected to the main frame of the machine 500. The reject assembly like the monitoring apparatus on the trimming stations also includes photo cell apparatus similar to that in the monitoring apparatus to prevent machine jam-up in the event that the substrate is not removed properly from the carrier 510 or that the mechanism has failed. As illustrated in the drawing, interiorly of the housing 651 is a ram 652 which is connected to a head 653 having horizontally projecting locating pins 524 adapted for engagement, as heretofore described, with the slots in the carrier 510. Also projecting from the ram is an ejector block 654 which is adapted to engage the pin side of the substrate 501 and remove the substrate from the carrier 510. When the ejector block 654 contacts the substrate it pushed the same through into an ejector chute 656 for disposal of the rejected substrate.

Figure 34:
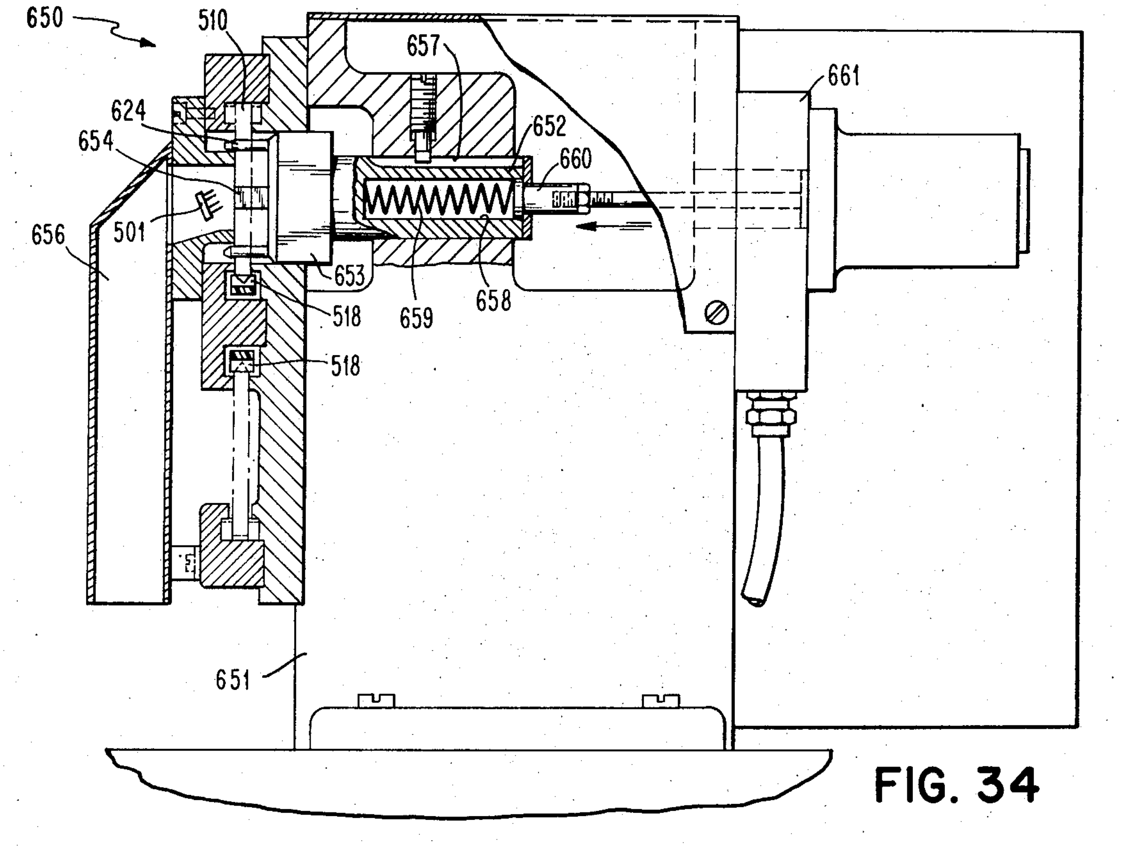
FIG. 34 is a fragmentary side elevational sectional view of a portion of the substrate reject mechanism illustrated in FIG. 13.
Figure 35:
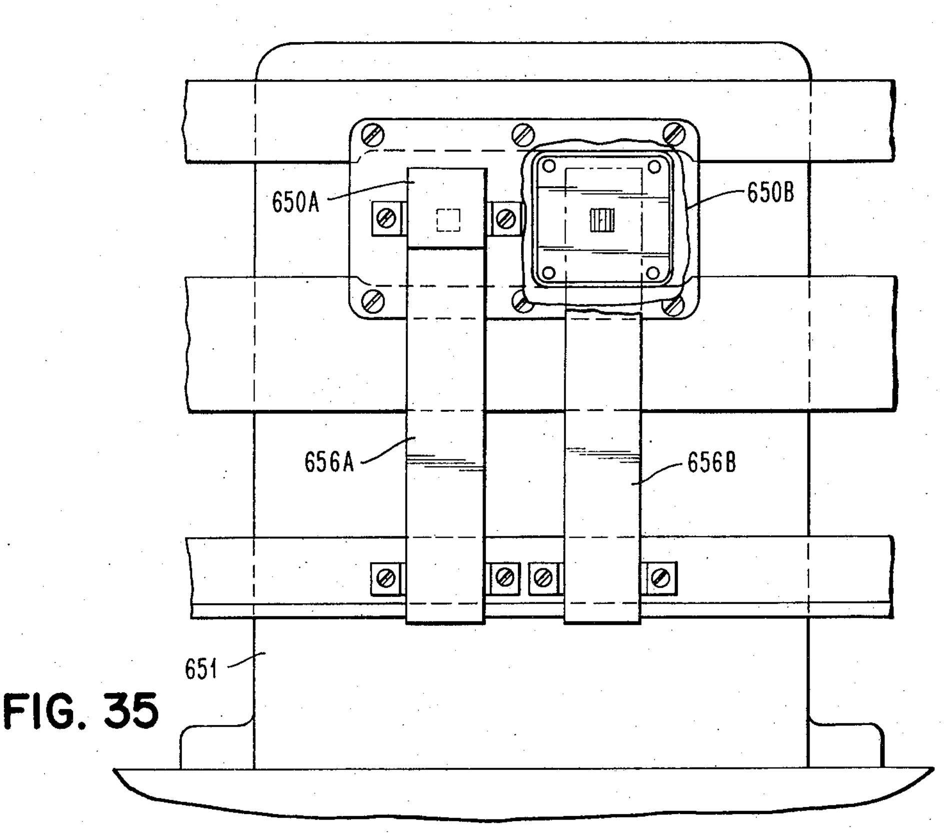
FIG. 35 is a fragmentary end view of the apparatus illustrated in FIG. 34.

As illustrated in FIG. 34, the ram 652 is slideably engaged in a bore 657, the ram having a tubular portion 658 for housing, for example, a spring 659 which is engaged by a piston 660 connected to the hydraulic system 661. The spring serves as a cushion which prevents the ram 652 from exerting excessive pressure on the carrier in the event misalignment occurs. In the event that a device is not able to be trimmed or is overtrimmed at one of the stations, the monitoring apparatus heretofore described starts conventional counter apparatus which counts the number of stations that particular substrate must go through prior to alignment with the reject assembly and once the carrier with the bad substrate is in registry with assembly the hydraulic mechanism is actuated causing ejection of the substrate from the carrier.

It should be recognized that in certain instances a substrate will be rejected for some reason other than just an over value or under specification reason. For example, if a pin on the substrate is bent or if the substrate is not properly seated and monitoring does not occur, such a substrate should not be rejected as bad product. In these circumstances it has been found that selective rejection can be profitable without undue complexity or cost. To this end and referring to FIG. 35, a double reject station may be provided so that modules or substrates with defects other than over value may be rejected and segregated automatically. The double station is labelled 650A and 650B for purposes of identification and each is identical to the reject mechanism described in FIG. 34, each including reject ram mechanism and identical reject chutes 656A and 656B.

TRANSFER APPARATUS

Figure 20:
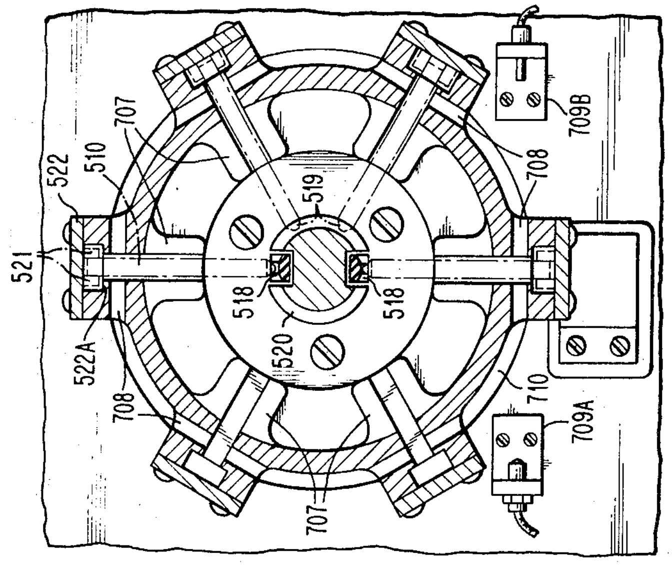
FIG. 20 is a fragmentary sectional view taken along line 20 —20 of FIG. 19.
Figure 19:
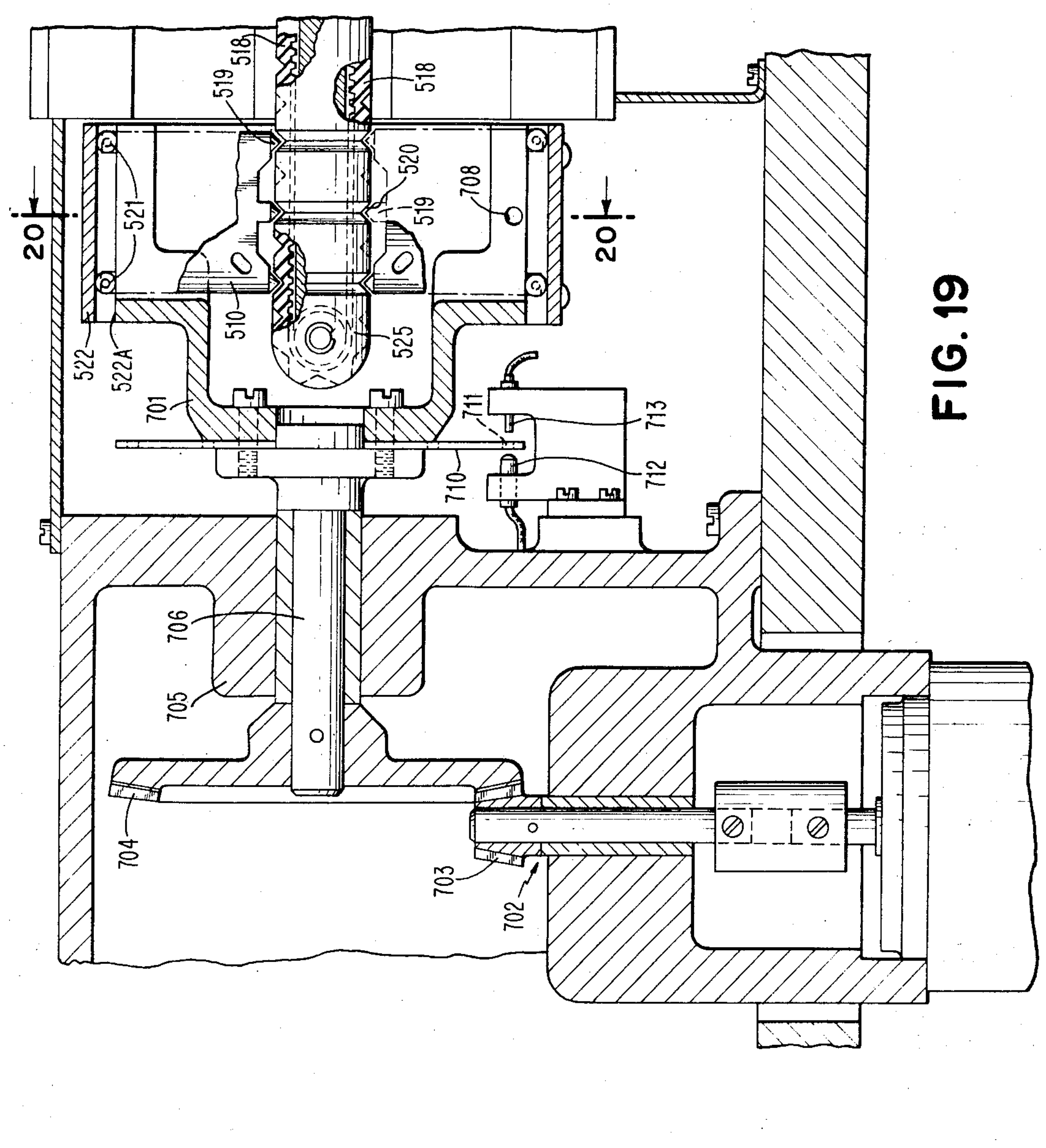
FIG. 19 is an enlarged fragmentary sectional view illustrating the transfer assembly for transferring carriers from the top to the bottom, or vice versa, of the conveyor.

After the substrate carriers 510 leave the reject station 650, and assuming for the time being that the carriers contain a trimmed substrate which has not been rejected at the reject station, the carriers move into a transfer mechanism which rotates the carrier from the top to the bottom of the belt conveyor 518 for transfer of the carrier to the unload station 800, heretofore described in FIG. 17. To this end and as best shown in FIGS. 19 and 20 the transfer assembly includes a rotatable bell-shaped housing 701 which is indexable about the longitudinal center line of the conveyor as by drive means 702 comprising a pinion gear 703 and a bevel gear 704 which is connected through a frame 705 via a shaft 706 to the housing 701. The housing includes a plurality of radially extending nests 707 which are adapted to receive the carriers 510 and impart rotation to the same until the teeth 519 on the carrier 510 are rotated from the upper portion of the belt to the lower portion of the belt on the opposite side of the drive wheel 525. As shown in the drawing the track 522 which has a ledge on the lower portion thereof 522A serves to support the wheels 521 so as to permit proper mating of the teeth 519 into the slots 520 of the cog belt 518.

The timing of the rotation of the transfer apparatus or the housing 701 is such that the apparatus rotates only when the conveyor 518 is at rest and alternatively does not move when the conveyor is indexing. To insure proper timed sequential operation of the conveyor 518 and the housing 701, a disc 710 having a plurality of apertures 711 therein corresponding to the number and position of nests 707 in the housing 701 is connected to the housing 701 for rotation therewith. The disc is interposed between a light 712 and photo cell 713, the photo cell being activated when a hole 711 aligns with the light 712. In this manner, the simple control means of the photo cell and light maintain, in a conventional manner, the timing of the rotational indexing of the housing 701 with the conveyor 518 motion. For example, when the photo cell 713 is activated this de-energizes the drive means 702 and activates the conveyor indexing mechanism until the conveyor drive wheel, for example, is de-energized at which time the drive means 702 may be re-energized. Additionally, to prevent jam-up of the transfer mechanism, and to act as a safety feature, each of the nests 707 is provided with a see-through passageway 708 which is disposed intermediate secondary light and photo cell means 709A, 709B when the nests 707 are in the lower or bottom position. By latching the photo cell 709B output to the circuitry of the photo cell 713, such jam-up will not occur for if the photo cell 709B sees the light 709A through the passage 708, the conveyor drive wheel 525 is not actuated. After the carrier has been transferred from the top to the bottom of the belt, it is indexed until it reaches the unload station wherein the substrates 501 are unloaded onto the rotary vacuum index mechanism 569 and the carrier is then moved through the transfer mechanism 700B back into the load station 550 for reloading of a new substrate. (See FIGS. 12, 13 and 17).

ABRASION CONTROL CIRCUITRY

In order to position the nozzle 601 accurately with respect to, for example, a resistor mounted on either the pin or pin head side of a substrate 501, and move the nozzle in either the X or Y axis direction so as to trim the resistor until it reaches a finite predetermined value, novel circuitry is provided for controlling both the initial (home, or set) position of the nozzle relative to the substrate and for imparting one of X or Y axis motion to the nozzle 601 during the trimming operation.

Figures 36, 37, 38:
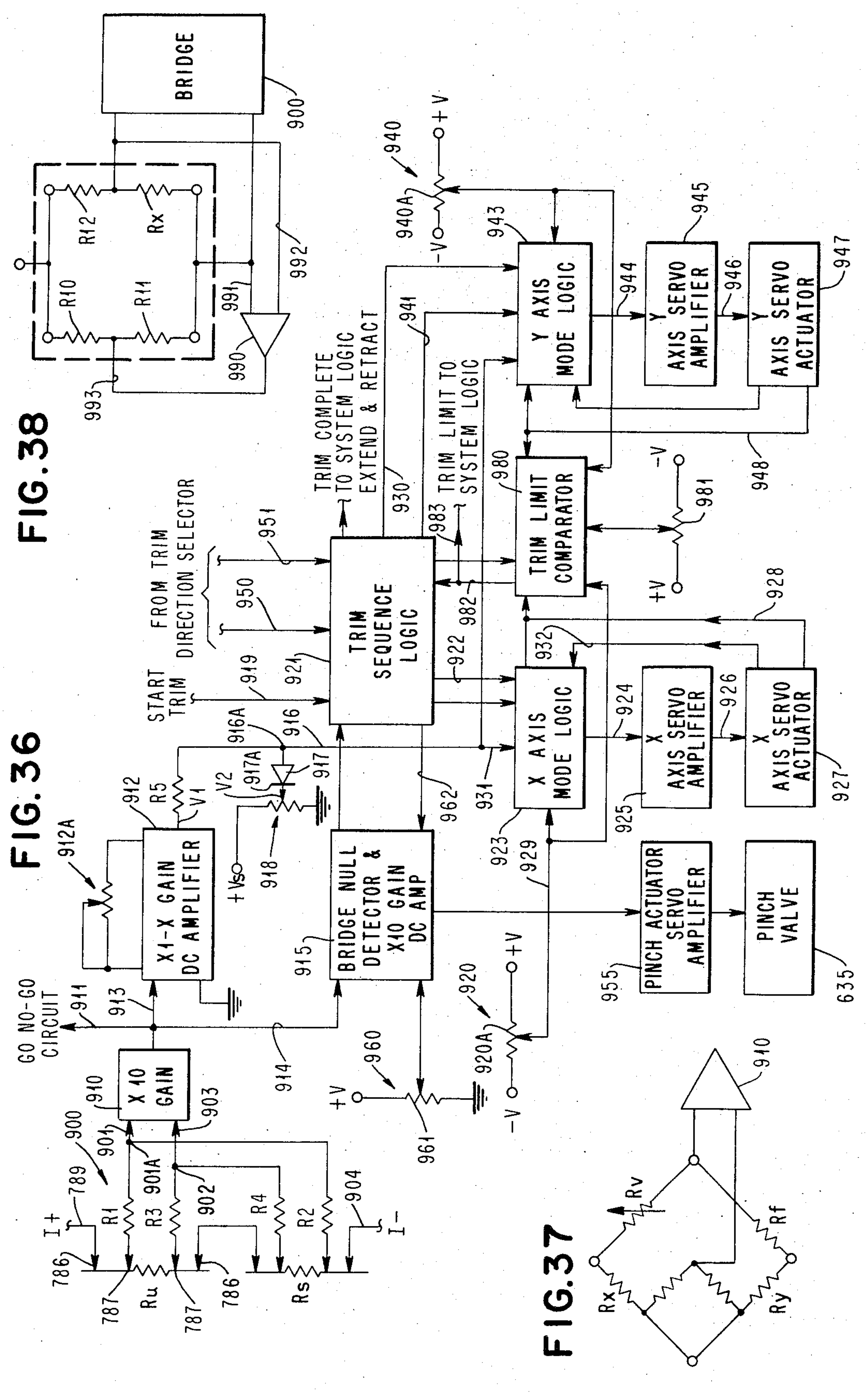
FIG. 36 is a schematic block diagram of the abrasion control circuitry, portions of which are constructed in accordance with the present invention.
FIG. 37 is a schematic circuit diagram of monitoring circuitry for trimming in which it is desired to trim one resistor in a ratio to a second resistor.
FIG. 38 is a schematic circuit diagram of circuitry utilized to isolate a resistor being trimmed in a network of resistors.

To this end and in accordance with one feature of the invention, the trimming operation initiates at a uniform high velocity and then deaccelerates until a final precise value is reached at which time the particulate matter or grit flow from the nozzle 601 is pinched off as by the hammer 606 against the anvil 605. Referring now to FIG. 36 a four-point Kelvin bridge 900 monitors the resistor value as it is being trimmed. When an electrical current is applied to the Kelvin bridge between the terminals I+ and I− a differential voltage drop occurs between the resistor being trimmed and a standard or known resistor value. The difference voltage is first amplified by a precision instrumentation amplifier 910 and then is applied through associated amplification stages to an X axis servo actuator which is connected to the rod 614A (see FIG. 36) or to a Y axis servo actuator which drives the actuating rod 613A.

The four point Kelvin bridge is comprised of four resistors, R1 and R2 forming one side of the bridge and Rs and Ru forming the opposite side of the bridge. With an electrical current applied to terminals I+ and I− the output voltage from one side of the bridge is taken from the junction of R1 and R2 through lead 901A to the instrumentation amplifier 910, while the output voltage from the opposite side of the bridge is taken from the junction of Ru the unknown resistor being trimmed, and Rs, the standard resistor, through summing junction resistors R3 and R4 which compensate for lead length and contact resistance. The output from resistors R3 and R4 at junction 902 gives an indication to the instrumentation amplifier 910 through lead 903, of the voltage difference across the standard resistor Rs and the unknown resistor Ru being trimmed. As may be seen from the drawing, the probe points may be compared with, for example, FIGS. 31 and 33 in which the upper and lower contact to resistor Ru corresponds to contact 786 and the intermediate ones correspond to contacts 787. Current source I+ and I− provides through leads 789 and 904 respectively, a positive and negative potential. As shown, current flows through the contact 786, the unknown resistor Ru, through contact 786, resistor Rs to I− (contact 904). As is evident from the schematic drawing, a small current will flow through R3 and R4 giving a differential voltage at the summing junction 902. Obviously the same is true for the parallel path R1 and R2 (relative to Ru and Rs). Although constant current power supplies may be used in the particular 4 point Kelvin bridge illustrated, a constant voltage power supply has been found to have faster reaction time. Typically in the bridge, with resistors R1 and R2 equal to each other in ohmic value, the differential voltage between lines 901A and 903 is zero when Ru has been trimmed to be equal in ohmic value to Rs.

The differential voltage appearing between junctions 902 and 901 on 20—and 903 respectively is fed into the instrumentation amplifier 910 wherein it is amplified to operate associated circuitry for driving either the X or Y positioning apparatus (FIGS. 22–25). An amplified output is sampled as at lead 911 through go, no-go circuitry (not shown) which will indicate initially whether the value of the resistor is either too high or too low to be trimmed. Thus, for example, if the resistor is to be trimmed to 2,000 ohms and since the more resistor material present the lower the resistance, if the initial reading of Ru was 3,000 ohms there is no reason for going through a trimming cycle. In this event, the associated go, no-go circuitry will actuate a shift register so as to permit rejection of the module or substrate 501 at the reject station. On the other hand, if the amount of material on the substrate, which is to be trimmed, is so great as to cause an excessively low condition to exist, the amount of material to be removed would mean that the resistor would not have adequate power handling capability after trimming and depending upon the particulate value of the lower limit would also indicate to a shift register a reject module.

Assuming that the output from the instrumentation amplifier is between preset upper and lower limits, the output voltage from amplifier 910 is fed to an adjustable gain DC amplifier 912 through lead 913, and another portion of the output from the instrumentation amplifier 910 is fed through lead 914 to a DC amplifier and bridge null detector 915. Typically the gain of the instrumentation amplifier 910 is approximately 10, the adjustable gain amplifier 912 between 1 and 11 and the amplifier associated with and prior to the bridge null detector 915 approximately 10.

The gain of the adjustable gain amplifier in association with trim rate circuitry determines the velocity and deacceleration rate of the nozzle 601 in its movement in either the X or Y direction. The gain of the amplifier 912 may be adjusted in a conventional manner as by a "deacceleration rate" potentiometer 912A which will serve to vary the output voltage V1 of the amplifier.

In order to maintain a predetermined but adjustable constant velocity of the nozzle while permitting deacceleration at a predetermined and preset point prior to the resistor Ru reaching and equalling the value of the standard resistor Rs, means are provided for permitting an adjustment of the maximum voltage that actuates the servo actuators driving the actuator rods 613A and 614A (FIG. 22). To this end and referring to FIG. 36, the output voltage V1 from the adjustable gain DC amplifier 912 is provided with a simple, but effective shunting clamp circuit which acts very much like a zener diode regulator circuit, but its regulating voltage is adjustable by the maximum trim rate potentiometer 918. As shown the output V1 supplies current through a current limiting resistor R5 and through a parallel shunt path connected to lead 916, the shunt path including a diode 917 and potentiometer 918 which is connected between ground and a voltage supply Vs. Depending upon the setting of the potentiometer 918 the voltage at the cathode end 917A of the diode 917 will be preset giving a voltage V2. If the voltage V1 is higher than V2, the voltage at the junction 916A on line 916 will be clamped at V2 because current will tend to flow through the shunt diode 917, and the potentiometer 918 to ground. On the other hand, when voltage V1 equals or is lower than voltage V2 no further current will flow through the diode and line 916 will assume a voltage equal to V1. Thus while the voltage V1 may be initially high when the standard resistor Rs is higher in value than Ru, as Ru is being trimmed and its resistance increases towards the value of Rs, the voltage V1 will decrease. At this point, as will be more fully explained hereinafter, as V1 becomes less than the value of V2, nozzle travel will deaccelerate. Thus potentiometer 918 controls the maximum trim rate, for obviously the higher the voltage V2 the higher the voltage possible on line 916, the trimming rate being determined by the voltage level on line 916. Alternately the rate of deacceleration is determined by the gain of the adjustable gain amplifier 912 inasmuch as the higher the gain of the amplifier 912 the higher the voltage V1 and therefore voltage V1 does not approach voltage V2 until the differential voltage from the bridge 900 is closer to 0. In this manner both trim rate and deacceleration rate may be controlled an preset at each of the trim stations.

Prior to the actual trimming operation, it is mandatory that the nozzle be positioned in the X, Y, and Z coordinate corresponding to the exact position of the resistor material to be trimmed on the substrate. As the carrier 510 moves into a trim station and the cog belt 518 is stopped the Z actuator automatically moves the nozzle into a position adjacent the substrate. As heretofore explained relative to FIG. 22 this is controlled by the hydraulic lines 615A and 616A and may be a direct mechanical relation, actuation-wise, to the dwell portion and movement of the cog belt 518. However, as may be visualized, the exact location of the resistor or resistors on a substrate may be varied from one particular lot of substrates to another particular lot. Accordingly, the nozzle is brought to a home position via the same actuators and circuitry which is controlled by the bridge 900.

The control system for moving the nozzle 601 is programmed to return the nozzle 601 to a start or home position upon the completion of each trimming operation. The start or home position in both the X and Y coordinates is adjustable by separate X and Y home position set controls designated 920 and 940 respectively. Assuming that the home position set is first made along the X axis as by actuation of the actuation rod 614A the absence of a start trim signal 919 energizes trim sequence logic 921 which energizes an X axis position command signal on line 922 for starting the X axis mode logic 923 in the positioning mode. The X axis mode logic 923, as illustrated in the drawing, has an output 924 which is imparted to a servo amplifier 925 which tends to open or close a valving arrangement (not shown) through lead 926 connected to an X axis servo actuator (valve and actuator combined) 927. The servo actuator 927 is connected directly to the actuation rod 614A (FIG. 22), the servo actuator 927 providing an electrical output through a first feedback line 928 which is fed back into the X axis mode logic 923. The voltage feedback from the position transducer of the X axis actuator to the X axis mode logic is compared with, in conventional comparison type circuitry, the voltage from potentiometer 920A the opposite sides of which are provided with a plus or minus voltage to permit an accurate positive or negative bias voltage to be fed into the logic 923 as through lead 929. As the feedback voltage appearing on line 928 approaches the voltage on line 929, the position error signal appearing on line 924 will obviously be reduced causing the X axis servo actuator 927 to slow down until the home set position has been reached.

The Y axis home position is accomplished in an identical way by identical circuitry, the absence of a start trim signal on line 919 energizing the trim sequence logic 921 and energizing the Y axis position command on line 941 which tells the Y axis mode logic 943 to compare the voltage output from a Y axis servo actuator 947, through line 948 with the Y axis home position potentiometer 940A and the positive or negative voltage appearing at the slider contact of the potentiometer. The voltage supplied to the Y axis logic from potentiometer 940A and the voltage feedback through line 948 from the Y axis servo actuator position transducer, creates a voltage difference which is indicative of the position error which is fed through line 944 into a Y axis servo actuator 945, a Y axis valve drive 946 which controls the valve arrangement for the Y axis servo actuator 947. As the difference between the voltage from the Y axis home position set 940 and the actuator feedback voltage 948 is reduced to zero the Y axis servo actuator valve drive signal on line 946 is reduced to zero and the trim apparatus is in a home position set for trimming a resistor on the substrate.

When the nozzle is in the home position, a trim direction selector energizes a line 950 in one of two modes, one of which is to trim on the X axis or the other of which is to trim on the Y axis, either of which also programs the trim sequence logic 921 and tells the logic along which axis the nozzle movement is to take. A second input through line 951 programs what the actuator is to extend or retract, i.e. when trimming is to be accomplished along the X axis the direction of nozzle movement is to the left or to the right from the home position set. Alternately, when trimming is to be accomplished along the Y axis the trimming accomplished by the nozzle is programmed to take place either in the up or down direction. Accordingly, the operator through appropriate voltages programmed into the trim sequence logic, for example, plus or minus voltage on 950 or 951 may program the trim sequence logic for either axis of trimming and either direction of trim. Inasmuch as resistors are conventionally deposited on the substrates for trimming on one or the other of the axis as opposed to being at an oblique angle, these controls actuate only one of the X or Y axis of the mode logic 923 or 943. Assuming that the program signal on the X or Y axis line 950 has indicated trimming on the X axis and that the program signal on the actuator extend/retract lead 951 indicates extend, lead 922 will carry a signal to the X axis mode logic 923 telling the logic to change from a positioning to a velocity mode, and will also send out a signal to the X axis mode logic through line 930 of either plus or minus to indicate direction of nozzle movement. Simultaneously, the trim sequence logic 921 will program a no voltage or zero voltage signal through line 941 through the Y axis mode logic 943 which will prevent movement of the Y axis servo actuator 947 by maintaining it in the positioning mode.

Assuming that the four point contacts are now made across the unknown resistor Ru (the resistor about to be trimmed), as has been previously explained a voltage VI will appear on line 916, if the output voltage of the adjustable gain amplifier 912 is higher than V2 the voltage appearing on line 916 will equal V2 which voltage will be fed into the X axis mode logic 923. The voltage is impressed upon line 931 which, as shown in the drawing, extends to both the X and Y axis mode logic 923 and 943 respectively but because of the zero signal condition on line 941 to the Y axis mode logic the signal is meaning-less to the Y axis mode logic, the X axis mode logic then puts out a voltage through the valve lead 926 energizing the X axis servo actuator 927 and causing it to move in the direction preset. A second feed back line 932 puts a voltage into the X axis mode logic 923 which is compared with the voltage V2 (assuming V1 is higher in numerical value than V2) causing the actuator 614A (FIG. 22) to drive the nozzle along the X axis at a rate determined by the voltage level on line 916. Upon the voltage on line 916 dropping below the value of V2, the voltage drive for the X axis servo actuator on line 926 is reduced causing the slowing down of the servo actuator until the voltage on line 916 is for all practical purposes zero. At this point the X axis servo actuator 927 stops.

In order to terminate the flow of particulate matter through the nozzle 601 the output from the bridge is monitored in the bridge null detector 915 to actuate the pinch servo actuator 955 which energizes the pinch valve 635 connected to the hammer 606 (see FIG. 22). As shown, the voltage is fed to the bridge null detector 915 and when it reaches zero a signal is emanated from the detector 914 stopping the trim sequence logic 921 de-energizing both the X and Y axis mode logic. Because the time from start trim to stop trim is of extremely short duration null bias 960 is fed to the bridge null detector 915 so that when the output of the detector reaches a predetermined amount the bridge null detector will act as if zero voltage difference was read by the bridge thus compensating for lag time in the circuitry, the hydraulics and in the particulate pinch-of valve. The null bias set is a simple potentiometer 961 from which a voltage may be adjustably applied to the bridge null detector. Additionally, it should be noted that upon the signal "start trim" being given to the trim logic a signal through lead 962 is given to the bridge null detector programming the bridge null detector to look at the input signal from the bridge.

In the event of malfunction, for example, if the trim nozzle overshoots its position to damage semiconductor chips and the like on the substrate, a simple biasing and comparison circuit is supplied for overriding the X or Y axis mode logics so as to terminate trimming and prevent possible damage to other devices on the substrate. To this end, and referring to the drawing, a trim limit comparitor 980 is provided with an adjustable trim length potentiometer 981 which sets a bias of either a positive or negative voltage from a positive and negative source +V and −V. This voltage is compared with the voltage from the X axis home position set 920 and the actuator position feedback on line 928 so as to limit the length of travel of the nozzle, for example, in the X direction. In the same manner voltage is fed into the trim limit comparitor from the Y axis home position set 940 which is compared to the Y axis servo actuator feedback signal on line 948. Thus setting the trim length potentiometer 981 permits nozzle travel until a finite voltage difference is obtained between the actuator position indication and the home position at which time the trim limit comparitor produces a signal on line 982 overriding and stopping the trim sequence logic as well as giving a stop indication signal on line 983.

In certain instances it may be desirable to compare or adjust one resistor to a preset and predetermined ratio with respect to another resistor on the substrate, for example, when setting up base bias resistors it may be desirable to have a ratio in a common emitter mode of, for example, 10 to 1. Accordingly, the ratio mode is adapted for comparing two substrate resistors to two standard resistors in a bridge. In this instance the bridge circuitry may be switched out and replaced with the circuitry schematically illustrated in FIG. 37. As shown in FIG. 37 the resistor Rx is the resistor to be trimmed to a preset and predetermined ratio of the value of the resistor Ry on the substrate. The resistor Rv is a variable resistor which in conjunction with Rs forms the opposite side of the bridge. By way of example, if substrate Ry has a known value of 50 ohms and it is desired to trim Rx to have a value of 500 ohms, the ratio of the substrate resistors is 10 to 1 and therefore the ratio of the corresponding bridge resistors Rv and Rs also must have a ratio of 10 to 1. Obviously when the ratio of the substrate resistors is the same as the ratio of the bridge resistors the inputs to the operational amplifier (instrument amplifier) 910 are equal and the amplifier output signals through the logic, heretofore described, that trimming is complete.

In certain instances where a plurality of resistors on a substrate are interconnected so that they may not be electrically isolated with any convenience, it is necessary to isolate the resistor being trimmed and compensate for the other resistors which are in circuit with the unknown resistor being abraded. This may be accomplished by compensation circuitry schematically illustrated in FIG. 38. The bridge circuitry is identical to the four point Kelvin bridge 900 illustrated in FIGS. 1 and 36 heretofore described. Assuming that there are, for example, four resistors R10, R11 and R12 interconnected to resistor Rx on the substrate, in a parallel network, the bridge 900 must measure the voltage drop across Rx only, not the parallel voltage drop across the other three resistors. To compensate for the other three resistors in the network, an operational amplifier 990, having unity gain and including inputs 991 and 992 from opposite sides of the resistor Rx, provides a compensating current through line 993 to the other side of the network to provide an equal voltage at the junction of R10 and R11 with respect to the voltage at the junction of R12 and Rx, thereby nullifying current flow through the other resistors. By utilizing the operational amplifier in this manner the circuit network remains balanced during trimming and the bridge senses only the voltage drop across the resistor Rx being trimmed.

Although the invention has been described with a certain degree of particularity, it is understood that the present disclosure has been made only by way of example and that numerous changes in the details of construction and the combination and arrangement of parts may be made without departing from the spirit and the scope of the invention as hereinafter claimed.

What is claimed is:

1. Apparatus for altering an electrical characteristic of an electrical component, comprising: trimming means for modifying said electrical characteristic of said component, said trimming means comprising means for abrading said component including a nozzle for dispelling a flow of particulate matter against said component; means for sensing the magnitude of said electrical characteristic as it is modified, means providing a variable rate of modification of said electrical characteristic responsive to the magnitude of said electrical characteristic, said latter mentioned means including means for setting the rate of modification of said electrical characteristic until the magnitude of said characteristic attains a first predetermined value, and thereafter deaccelerates the rate of modification until said component attains a second predetermined value.

2. Apparatus in accordance with claim 1 including means supporting said component adjacent said trimming means; and wherein said means providing a variable rate of modification of said electrical characteristic includes means for effecting relative movement between said trimming means and said support means.

3. Apparatus in accordance with claim 1 wherein said electrical component comprises a quantity of material on a substrate, said electrical characteristic being dependent on the quantity of said material.

4. Apparatus in accordance with claim 3 including lead means electrically connecting said material; said means for sensing the magnitude of said electrical characteristic including monitoring means electrically connected to said lead means.

5. Apparatus in accordance with claim 4 including bridge means connected to said monitoring means for determining the magnitude of said electrical characteristic of said component relative to an electrical characteristic of a predetermined magnitude; amplifying means for amplifying the difference between said electrical characteristic of said material as it is modified and said electrical characteristic of a predetermined magnitude, and means for clamping said difference at a predetermined magnitude.

6. Apparatus in accordance with claim 5 including means responsive to said difference after said first predetermined magnitude has been attained, for reducing the rate of modification of said electrical characteristic.

7. Apparatus in accordance with claim 1 wherein said electrical component is mounted on a substrate, pin means extending from said substrate and lead means electrically connecting said pin means to said component; said means for sensing the magnitude of said electrical characteristic including monitoring means registerable with at least one of said connecting means and said pin means, and bridge means connected to said monitoring means for determining the magnitude of said electrical characteristic of said component relative to an electrical characteristic of a predetermined magnitude.

8. Apparatus for trimming a material having electrical characteristic dependent upon the quantity of material being trimmed, comprising: trimming means for removing portions of said material, said trimming means comprising means for abrading said material including a nozzle for dispelling a flow of particulate matter against said material, means for generating electrical signals responsive to variations in said electrical characteristic as said material is removed; and means providing a first, presettable and fixed rate of material removal by said trimming means, and means providing a deacceleration of material removal by said trimming means responsive to said electrical signals.

9. Apparatus in accordance with claim 8 including means for positioning said nozzle relative to said material, and means for effecting relative movement between said material and said nozzle as said material is removed.

10. Apparatus in accordance with claim 9 including means responsive to said variations in said electrical characteristic for terminating the removal of material by said trimming means upon said electrical characteristic attaining a predetermined quantity.

11. Apparatus for trimming a material having at least one electrical characteristic dependent upon the quantity of material removed, comprising: trimming means for removing portions of said material, said trimming means comprising means for abrading said material including a nozzle for dispelling a flow of particulate matter against said material, means for monitoring said electrical characteristic of said material during removal of said material and generating electrical signals responsive to variations in said electrical characteristic; means responsive to said electrical signals for providing a first uniform rate of relative motion between said trimming means and said material, and a second deaccelerated rate of relative motion between said trimming means and said material upon a predetermined magnitude of said electrical characteristic being reached.

12. Apparatus in accordance with claim 11 including means responsive to said generated electrical signal for terminating said flow of particulate matter upon a predetermined electrical characteristic being obtained, said means for terminating said flow of particulate matter being positioned closely adjacent the point of egress of said particulate matter.

13. Apparatus in accordance with claim 12 including means to set an initial, predetermined rate of trimming of said material by said trimming means.

14. Apparatus for trimming, to a predetermined value, material on a substrate, said material having an electrical characteristic dependent on the quantity of material on said substrate; said apparatus comprising: trimming means for removing a portion of said material on said substrate; means for supporting said substrate in close proximity to said trimming means; means for positioning at least one of said supporting means and trimming means to bring said means into a predetermined home position relative to said material; means for monitoring the electrical characteristic of the material in said substrate as said material is trimmed; means for effecting relative movement between said trimming means and said support means during the trimming of said material; and means responsive to said electrical characteristic of the material during trimming for deaccelerating the relative movement between said trimming means and said support means as the electrical characteristic approaches a predetermined value.

15. Apparatus for trimming in accordance with claim 14 including means for setting a constant rate of trimming and means for setting the point at which the rate of relative movement between said trimming means and support means is deaccelerated.

16. Apparatus in accordance with claim 14 including means for terminating the trimming operation upon the electrical characteristic value reaching said predetermined value.

17. Apparatus in accordance with claim 16 wherein said trimming means comprises a nozzle, and means supplying said nozzle with a flow of particulate matter.

18. Apparatus in accordance with claim 17 wherein said means for terminating the supply of particulate matter comprises a particulate matter pinch off means including a hydraulic actuator means for pinching off the flow of particulate matter to said nozzle.

19. Apparatus in accordance with claim 18 including flexible hose means connected to said nozzle, and means to position said pinch off means adjacent to said nozzle and in registry with said flexible hose.

20. Apparatus in accordance with claim 14 wherein said means for positioning one of said support means and trimming means includes positioning means connected to said trimming means, said positioning means including means for moving said trimming means in a three axis coordinate system.

* * * * *